United States Patent
Kikushima et al.

(10) Patent No.: US 9,257,443 B1
(45) Date of Patent: Feb. 9, 2016

(54) MEMORY DEVICE AND METHOD FOR MANUFACTURING THE SAME

(71) Applicant: Kabushiki Kaisha Toshiba, Minato-ku (JP)

(72) Inventors: Fumie Kikushima, Yokkaichi (JP); Tatsuya Kato, Yokkaichi (JP); Wataru Sakamoto, Yokkaichi (JP); Fumitaka Arai, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/598,726

(22) Filed: Jan. 16, 2015

Related U.S. Application Data

(60) Provisional application No. 62/048,057, filed on Sep. 9, 2014.

(51) Int. Cl.
| | |
|---|---|
| H01L 27/115 | (2006.01) |
| H01L 23/528 | (2006.01) |
| H01L 23/532 | (2006.01) |
| H01L 29/423 | (2006.01) |
| H01L 29/49 | (2006.01) |
| H01L 21/02 | (2006.01) |
| H01L 21/28 | (2006.01) |
| H01L 29/788 | (2006.01) |

(52) U.S. Cl.
CPC ...... H01L 27/11556 (2013.01); H01L 21/0217 (2013.01); H01L 21/28273 (2013.01); H01L 23/5283 (2013.01); H01L 23/53271 (2013.01); H01L 27/11521 (2013.01); H01L 29/42376 (2013.01); H01L 29/495 (2013.01); H01L 29/4975 (2013.01); H01L 29/7883 (2013.01)

(58) Field of Classification Search
None
See application file for complete search history.

(56) References Cited

U.S. PATENT DOCUMENTS

| | | | | |
|---|---|---|---|---|
| 7,969,789 | B2* | 6/2011 | Katsumata et al. | 365/185.28 |
| 8,053,829 | B2* | 11/2011 | Kang et al. | 257/326 |
| 8,207,029 | B2* | 6/2012 | Ishikawa | 438/197 |
| 2007/0252201 | A1* | 11/2007 | Kito et al. | 257/331 |
| 2010/0276743 | A1* | 11/2010 | Kuniya et al. | 257/315 |
| 2010/0320528 | A1* | 12/2010 | Jeong et al. | 257/324 |
| 2011/0284947 | A1* | 11/2011 | Kito et al. | 257/324 |
| 2012/0009747 | A1* | 1/2012 | Kang et al. | 438/268 |
| 2012/0132981 | A1 | 5/2012 | Imamura et al. | |
| 2013/0062683 | A1 | 3/2013 | Fukuzumi et al. | |
| 2013/0248965 | A1* | 9/2013 | Nakai et al. | 257/315 |

FOREIGN PATENT DOCUMENTS

JP 2011-23586 2/2011

* cited by examiner

*Primary Examiner* — Scott B Geyer
(74) *Attorney, Agent, or Firm* — Oblon, McClelland, Maier & Neustadt, L.L.P.

(57) ABSTRACT

According to an embodiment, a semiconductor memory device includes a semiconductor pillar, a first electrode film, a second electrode film, a first insulating film, a second insulating film, and a wiring film. The semiconductor member is extending in a first direction. The first electrode film is disposed at the lateral side of the semiconductor member away from the semiconductor member. The second electrode film is provided between the semiconductor member and the first electrode film. The first insulating film is provided between the semiconductor member and the second electrode film. The second insulating film is provided between the second electrode film and the first electrode film. The wiring film is disposed in a wiring lead-out region adjacent to the memory cell region. And the first electrode film is formed of a material different from a material of the wiring film, and being electrically connected to the wiring film.

15 Claims, 28 Drawing Sheets

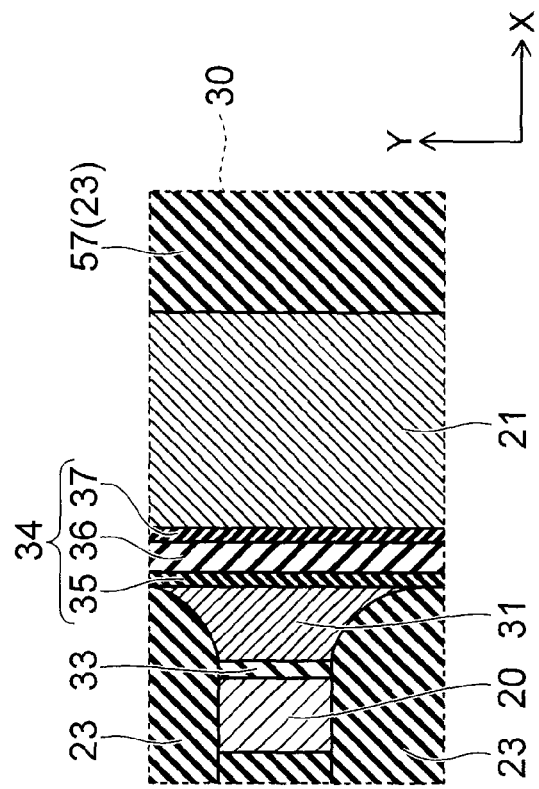
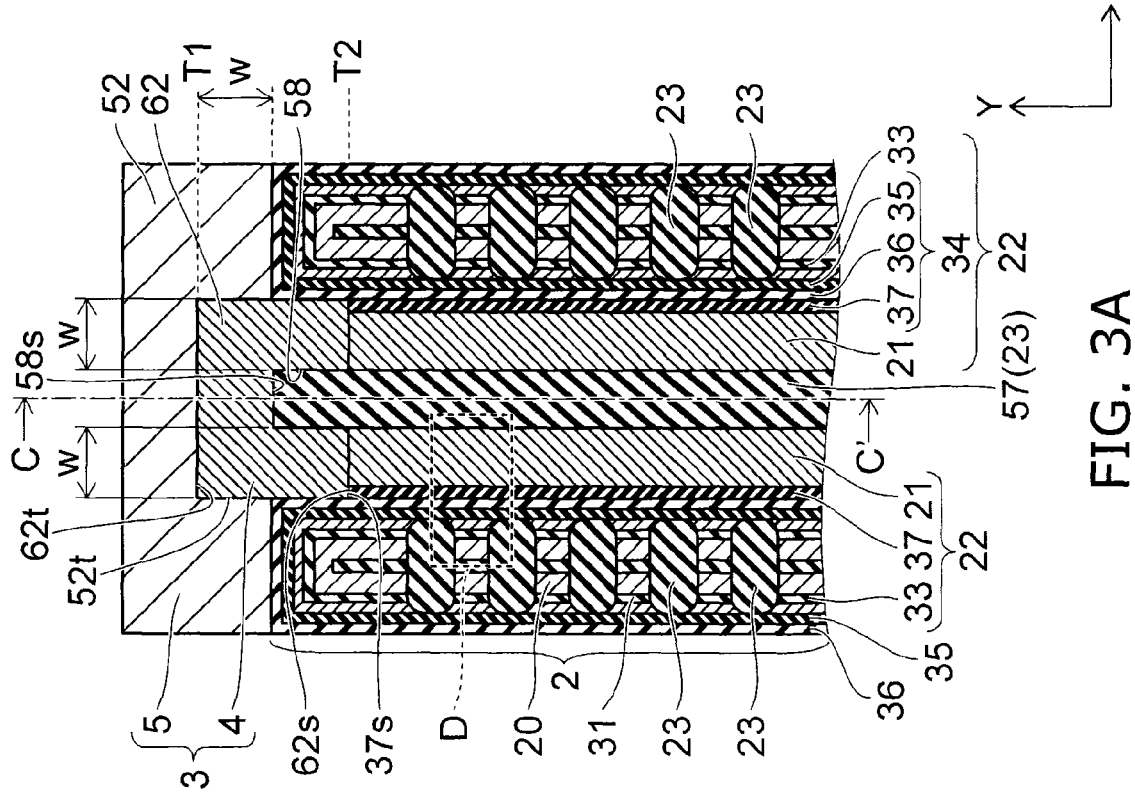
FIG. 3B
FIG. 3A

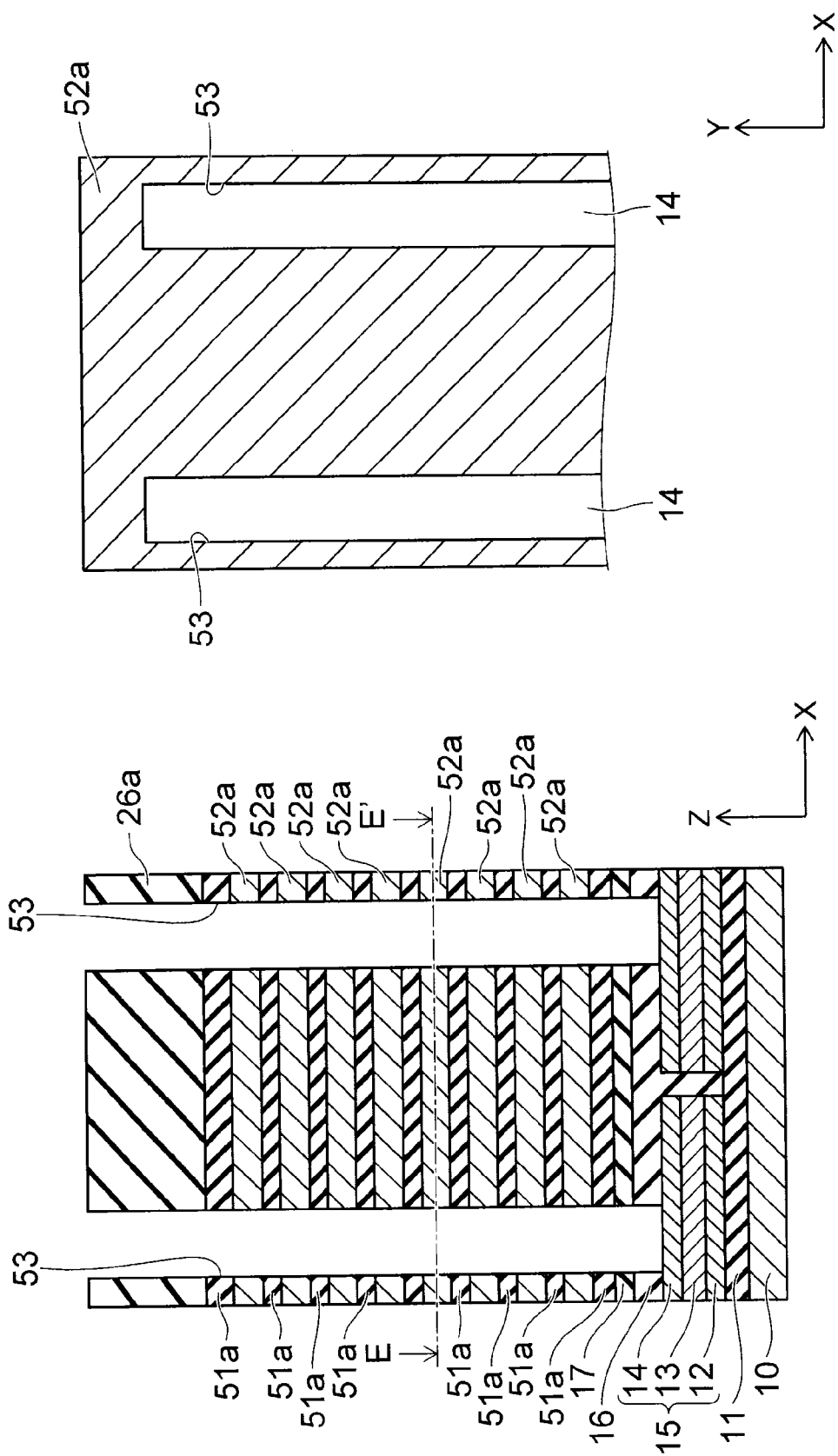

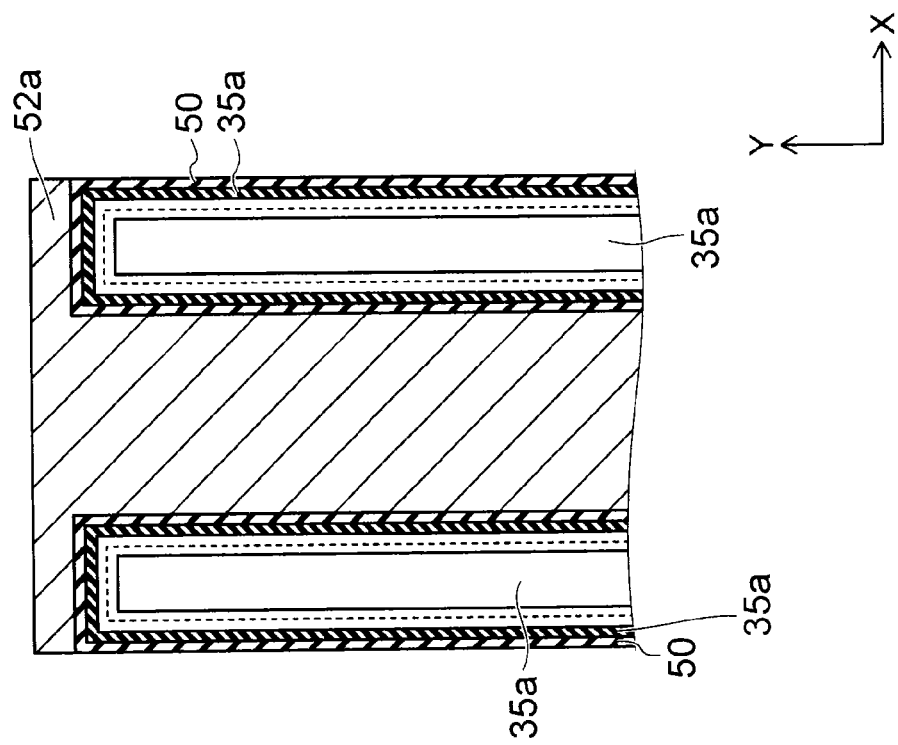
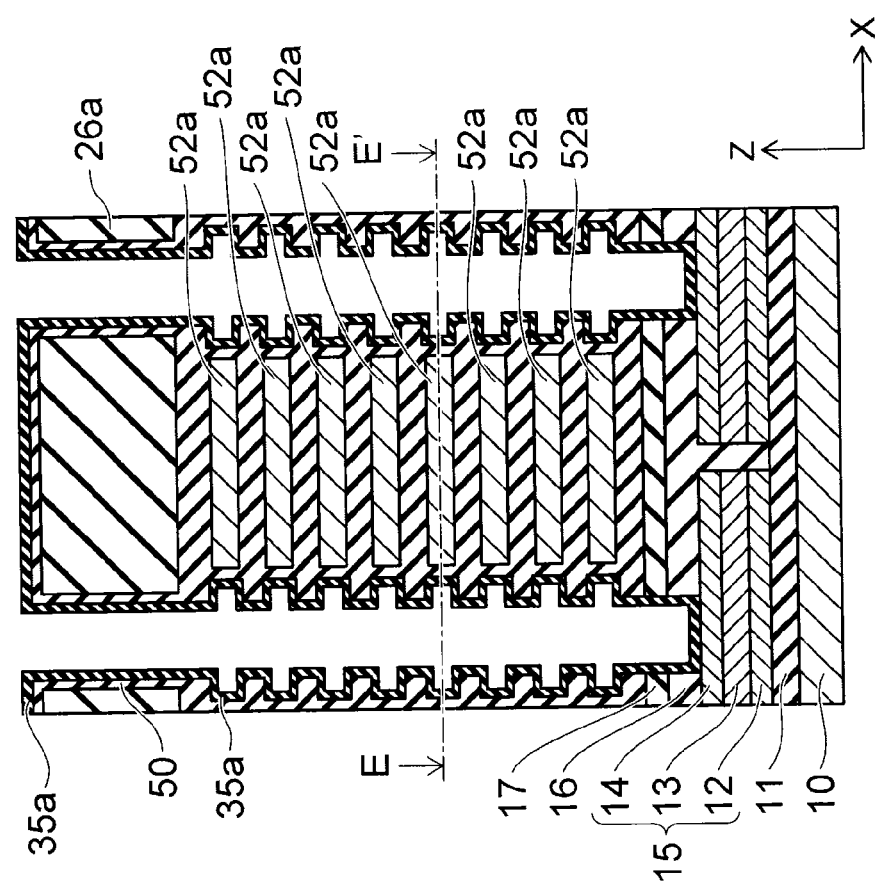
FIG. 11A
FIG. 11B

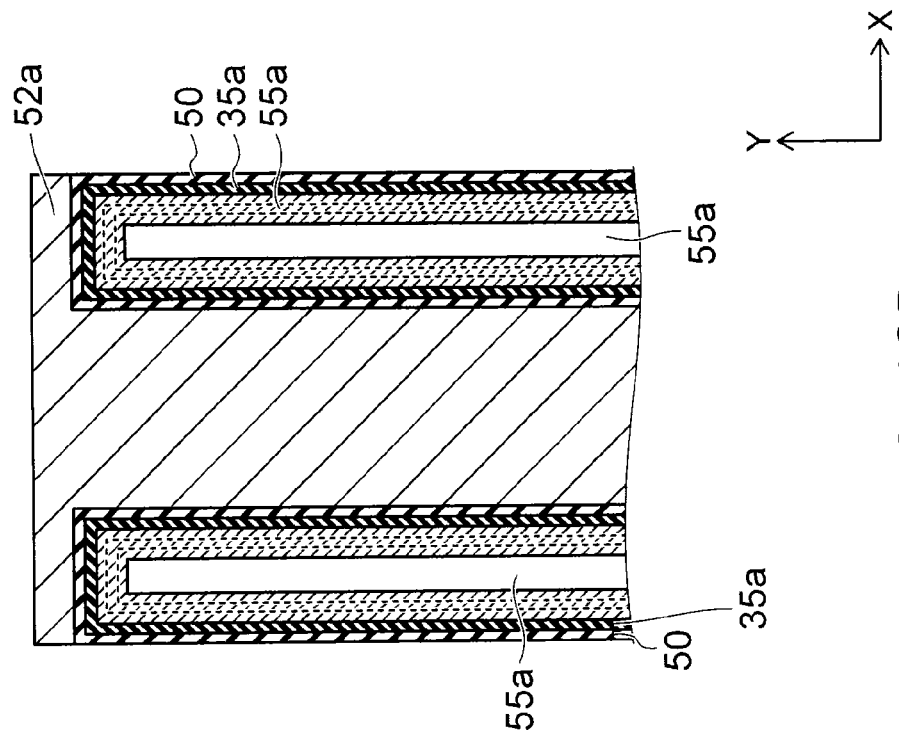
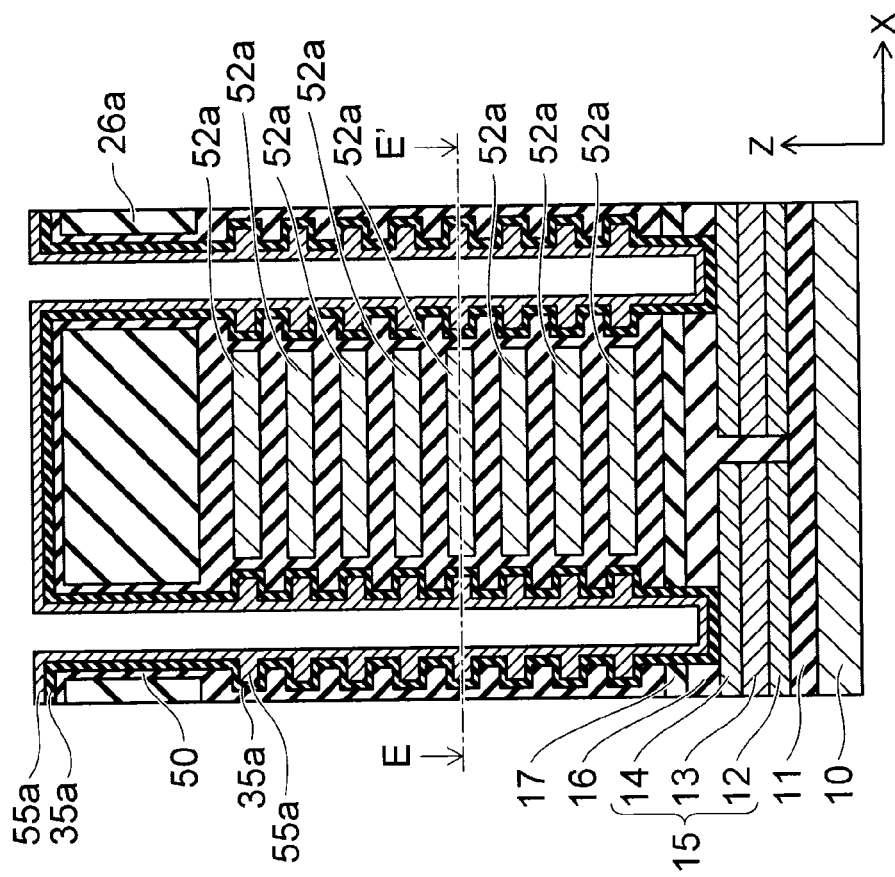
FIG. 12A
FIG. 12B

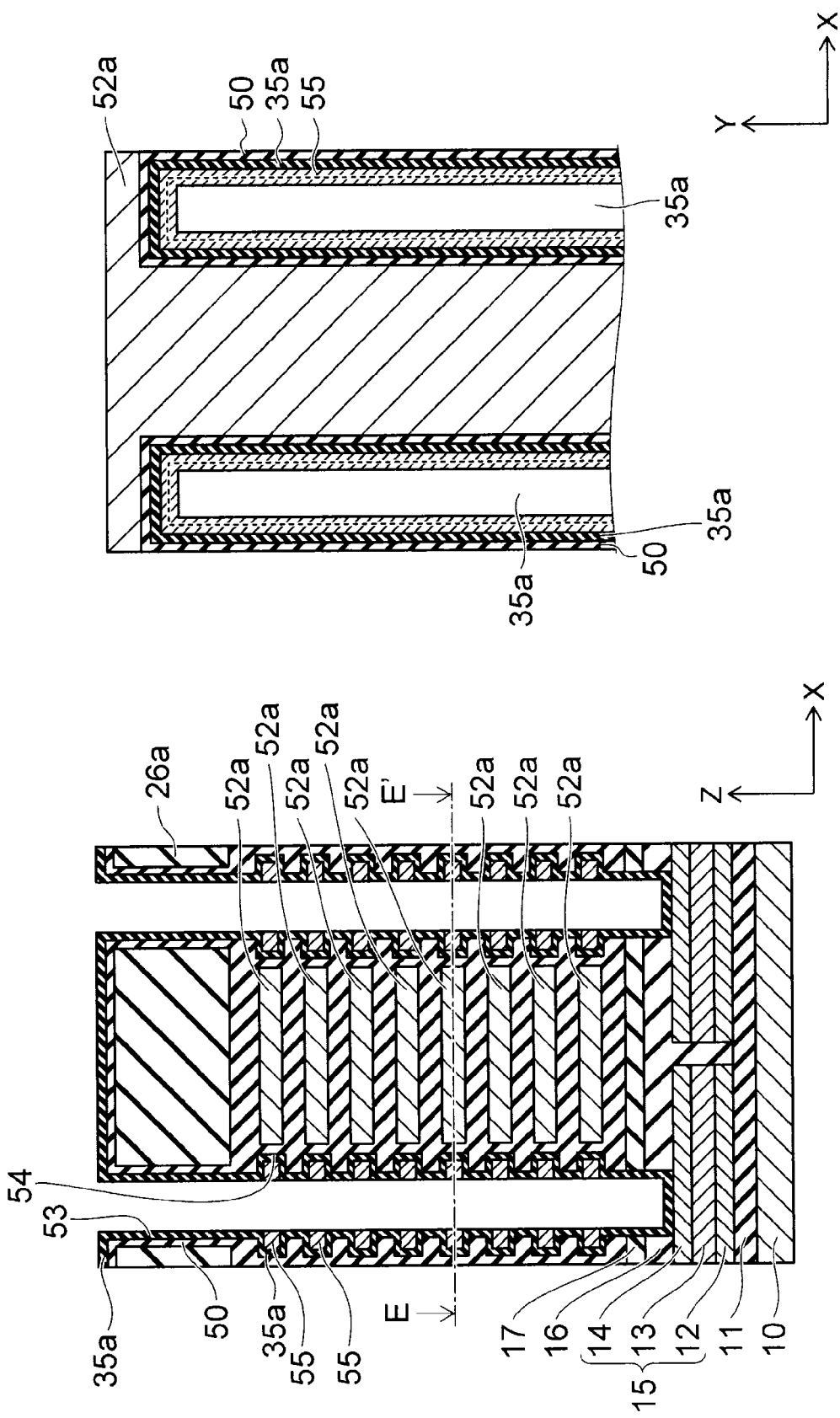

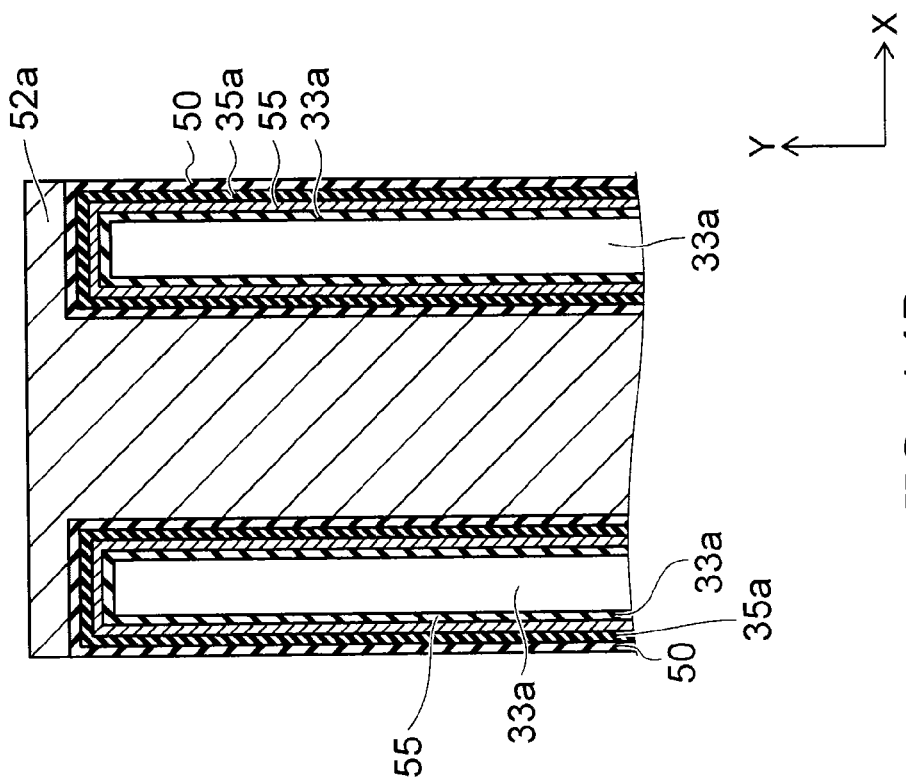
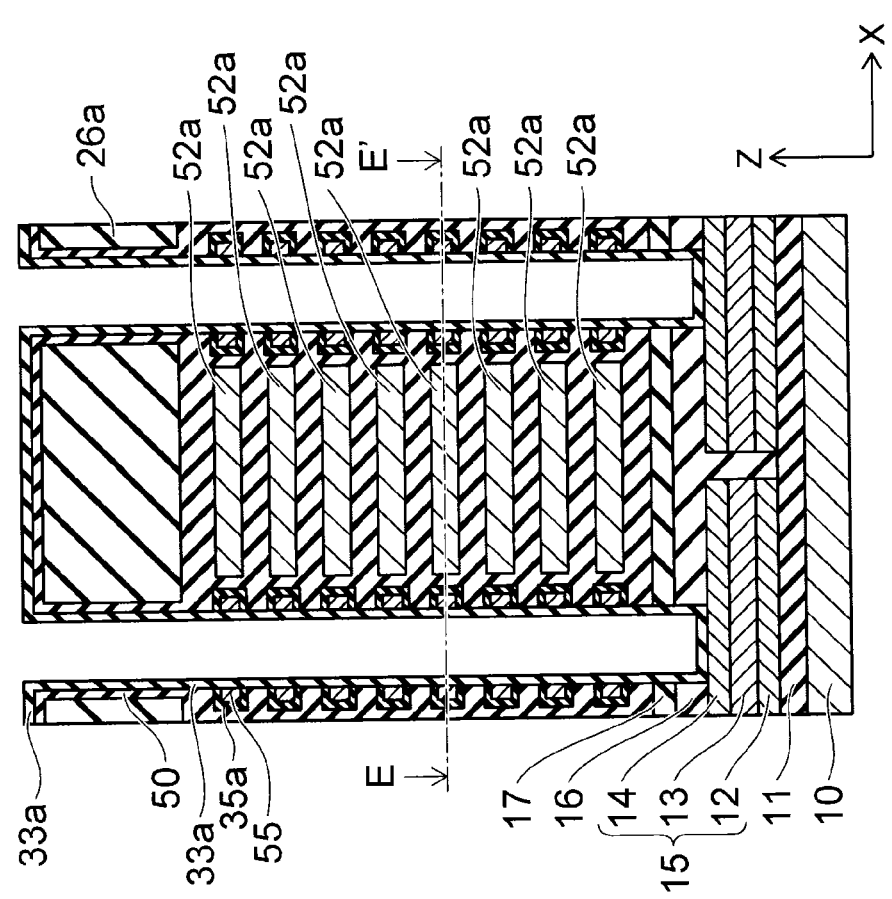
FIG. 14A
FIG. 14B

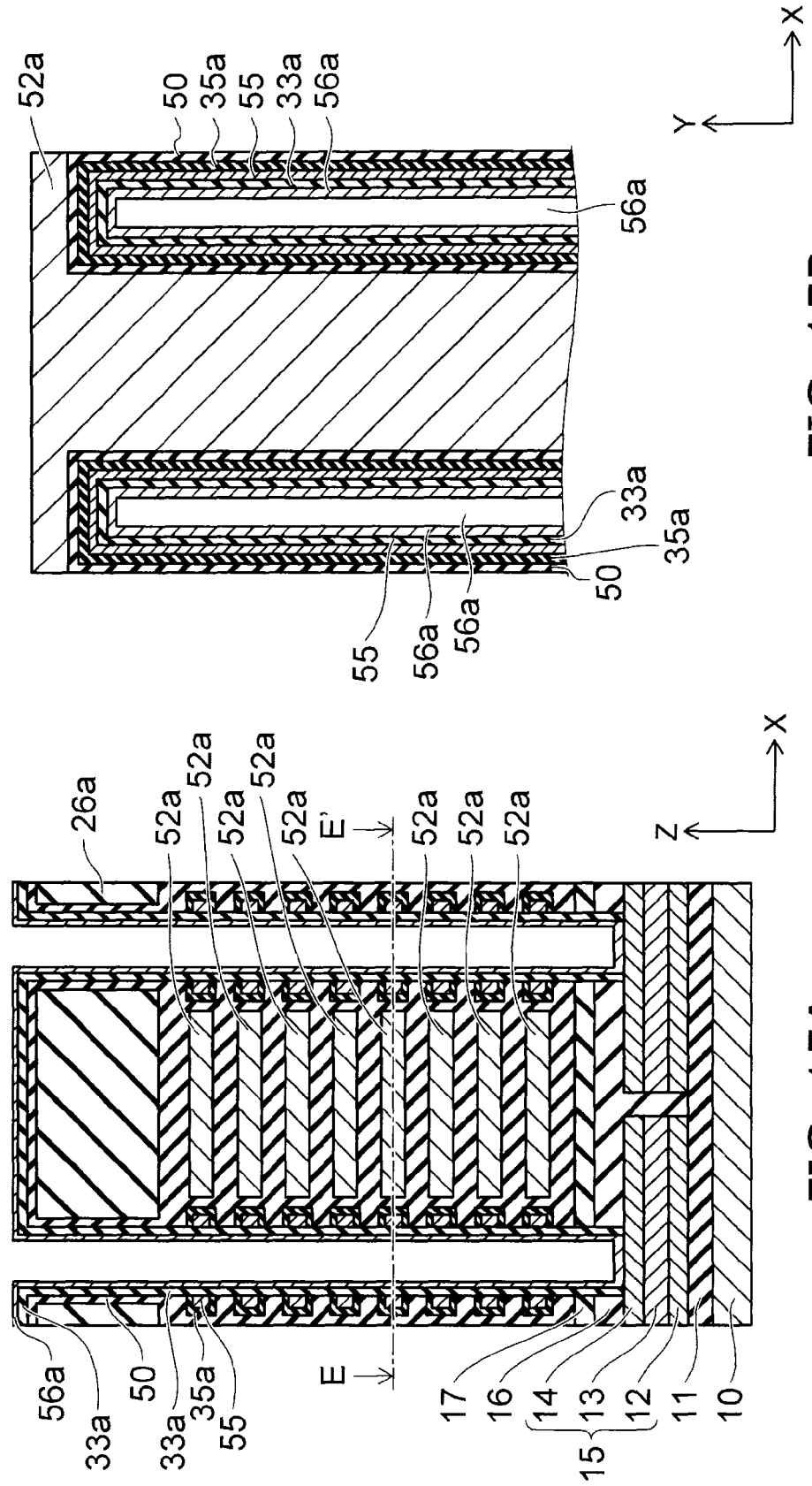

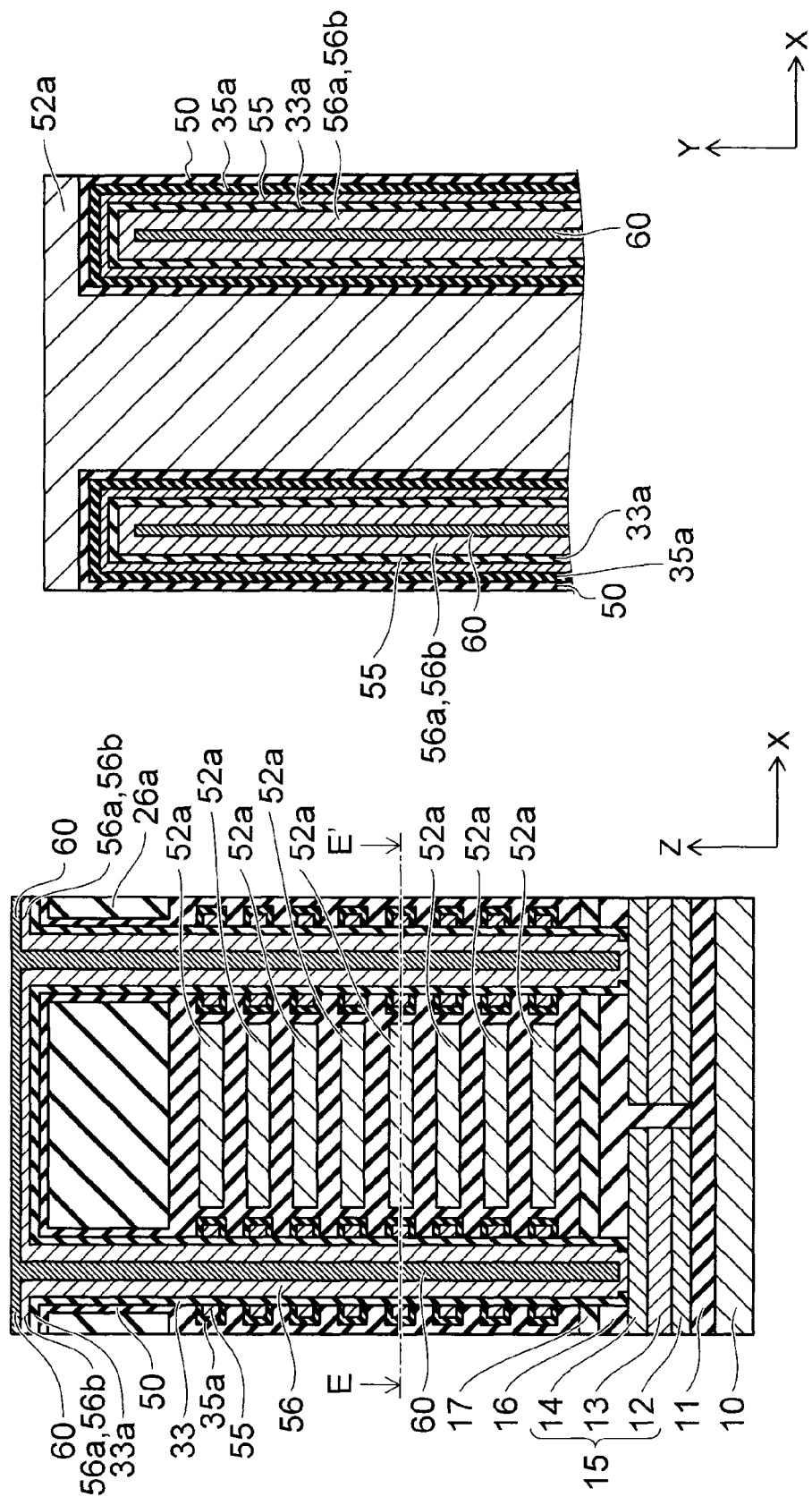

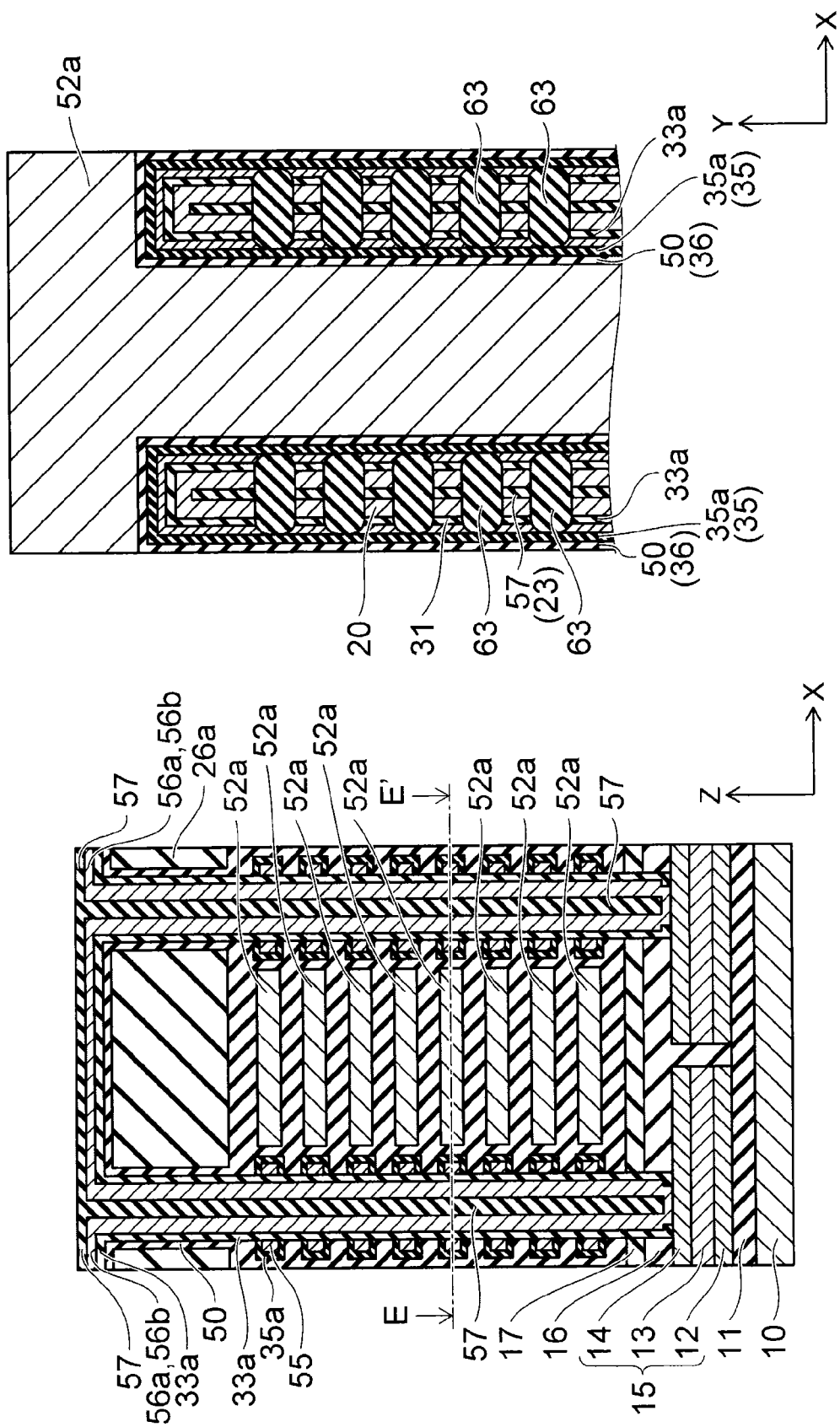

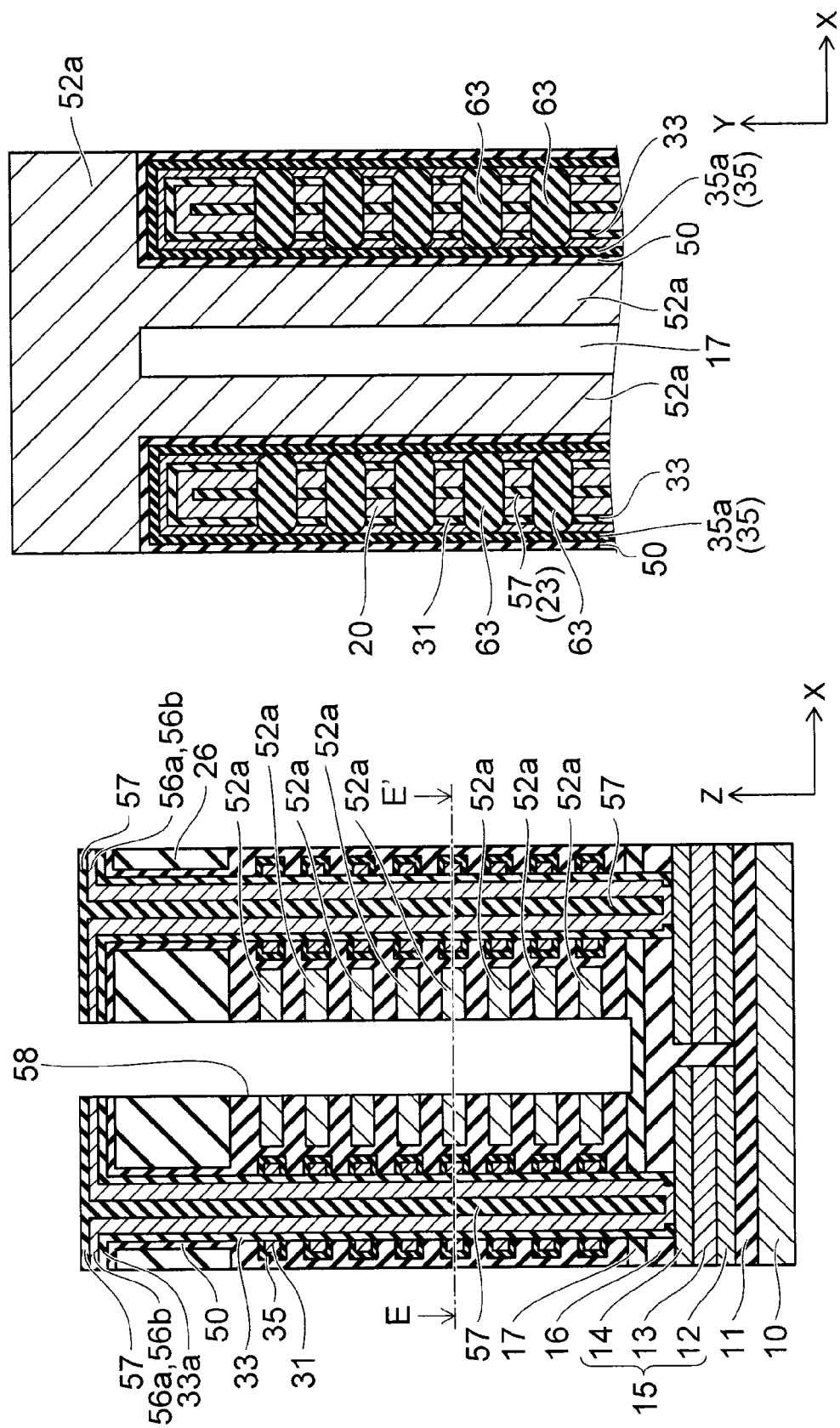

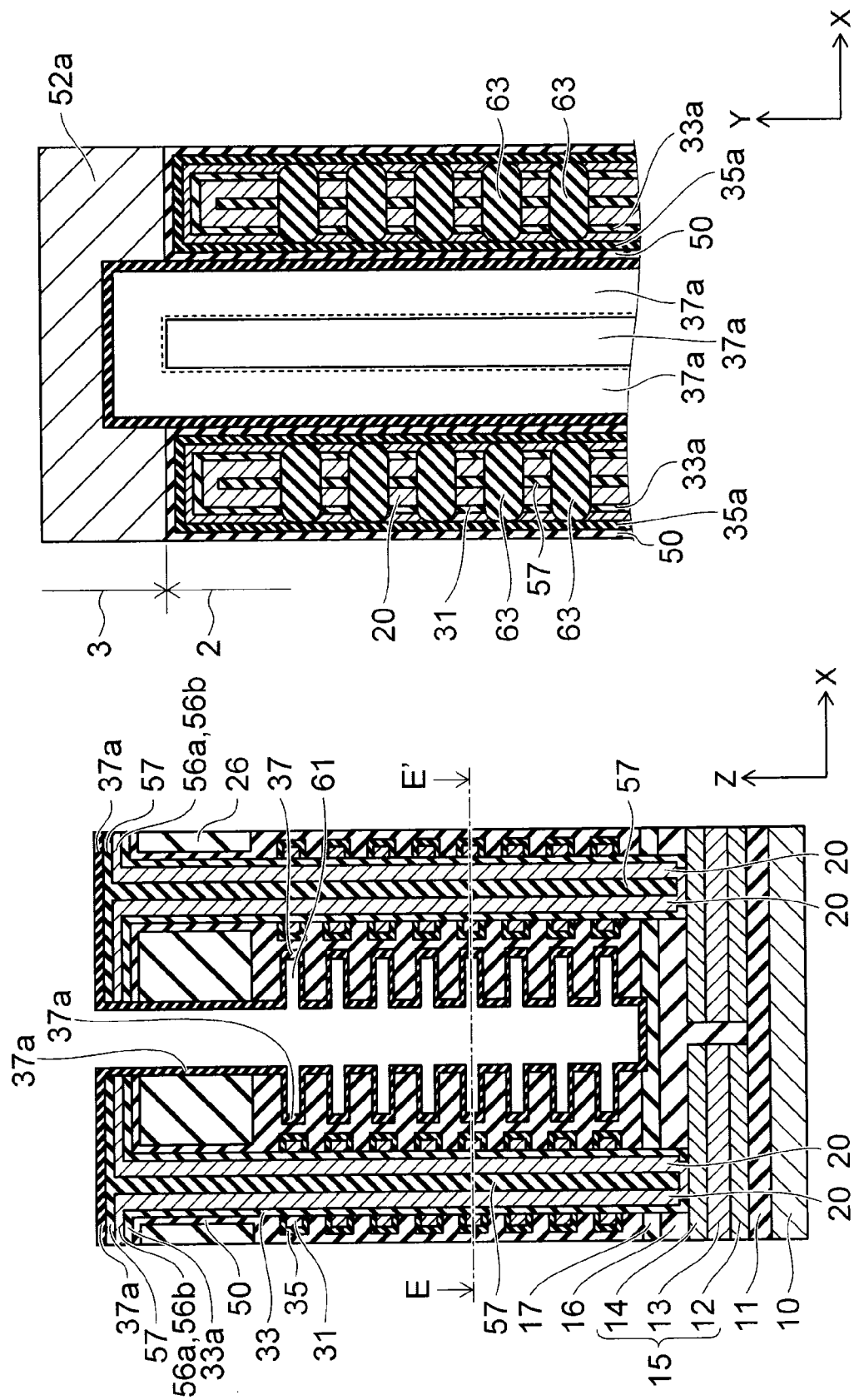

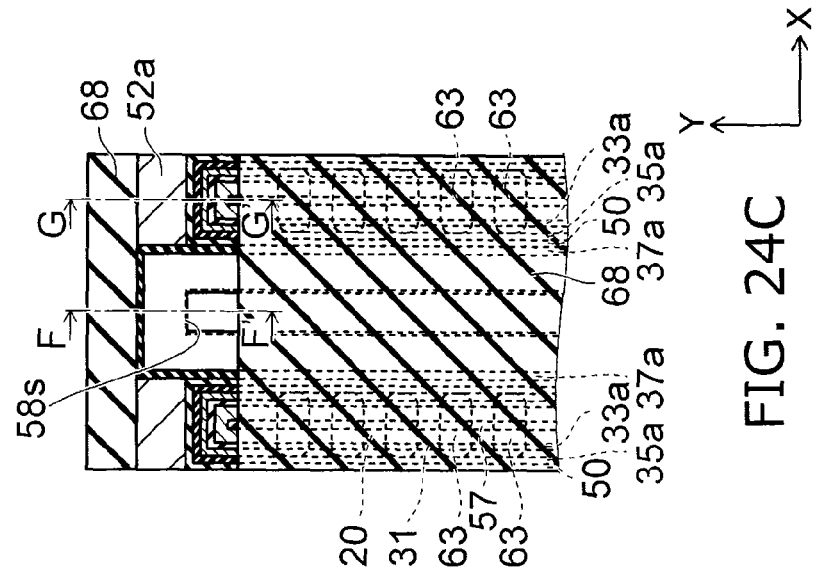
FIG. 24C
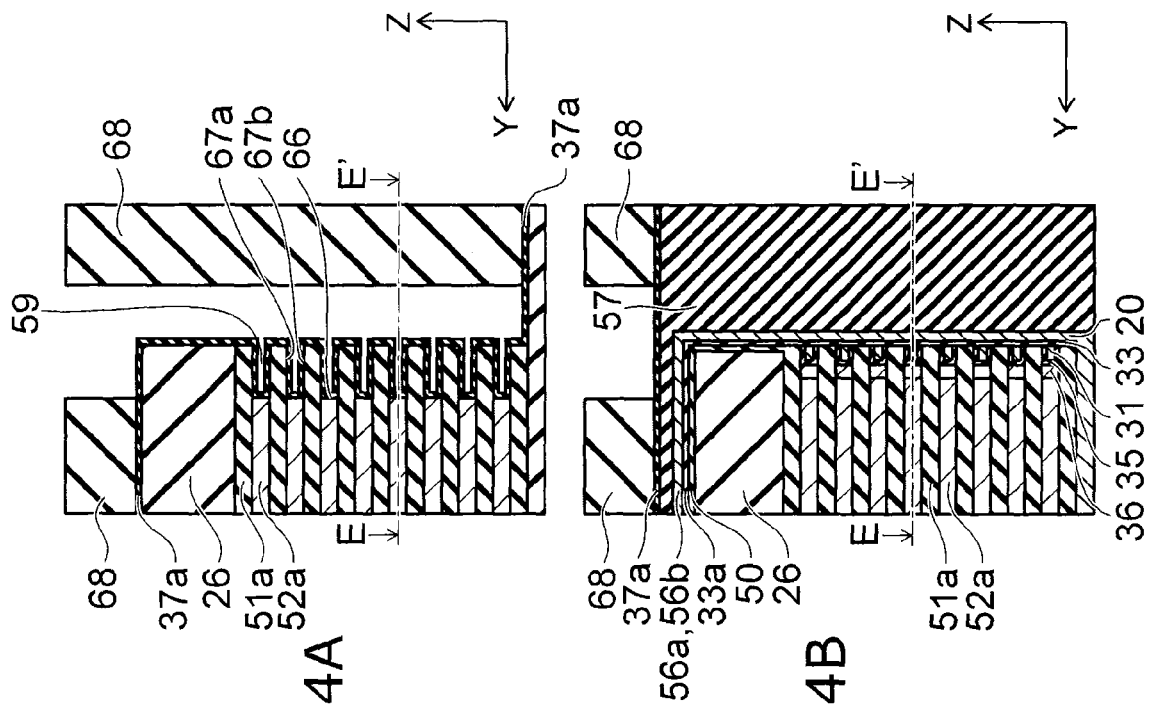
FIG. 24A
FIG. 24B

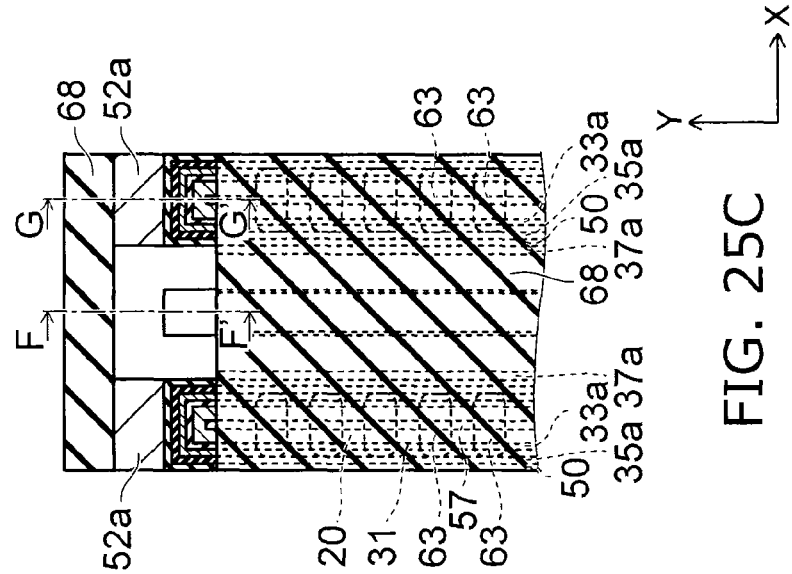
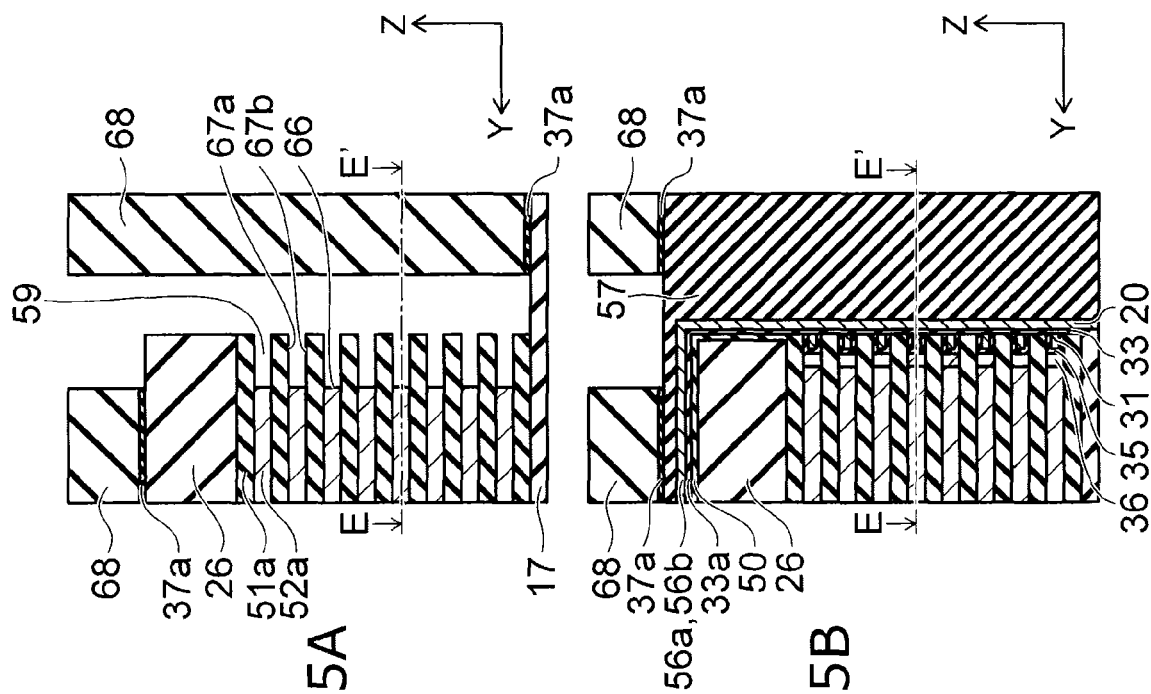

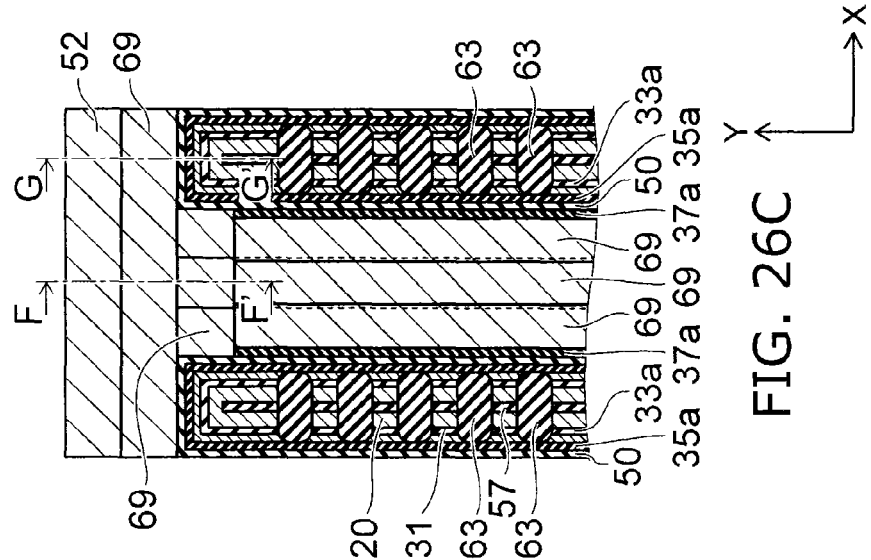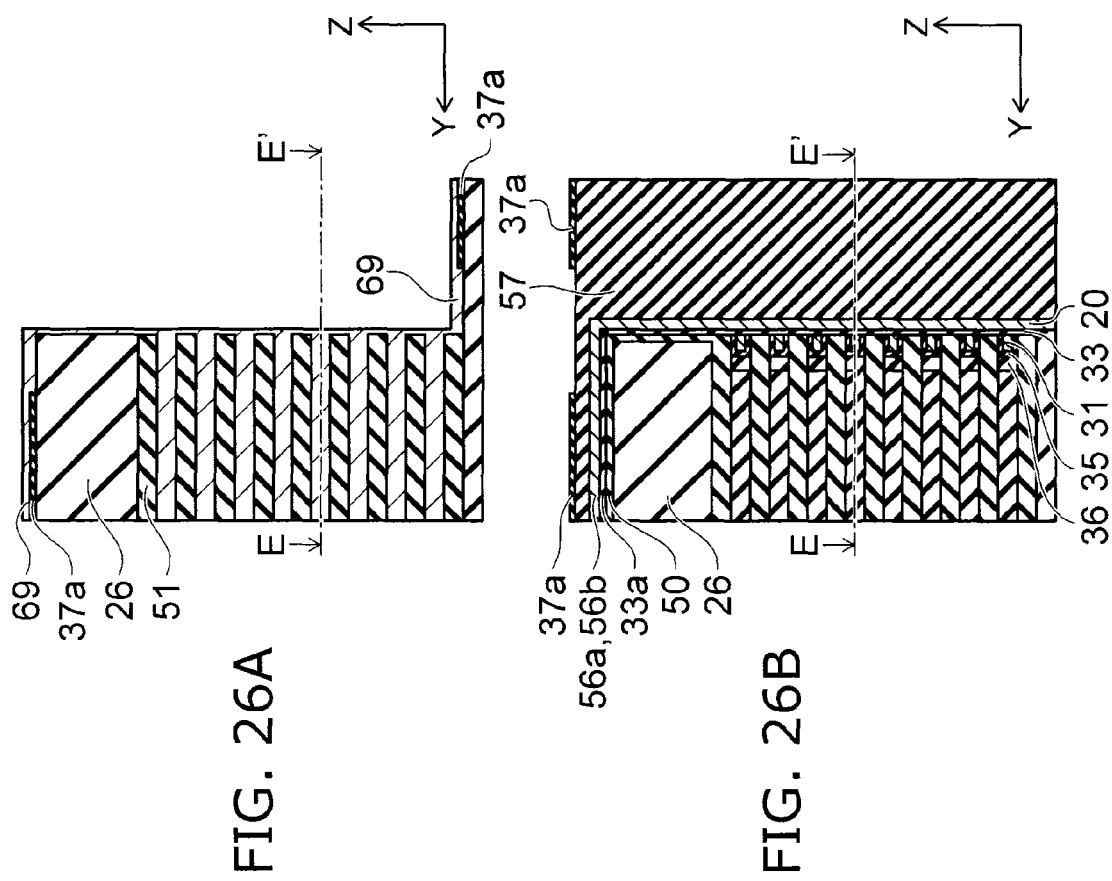

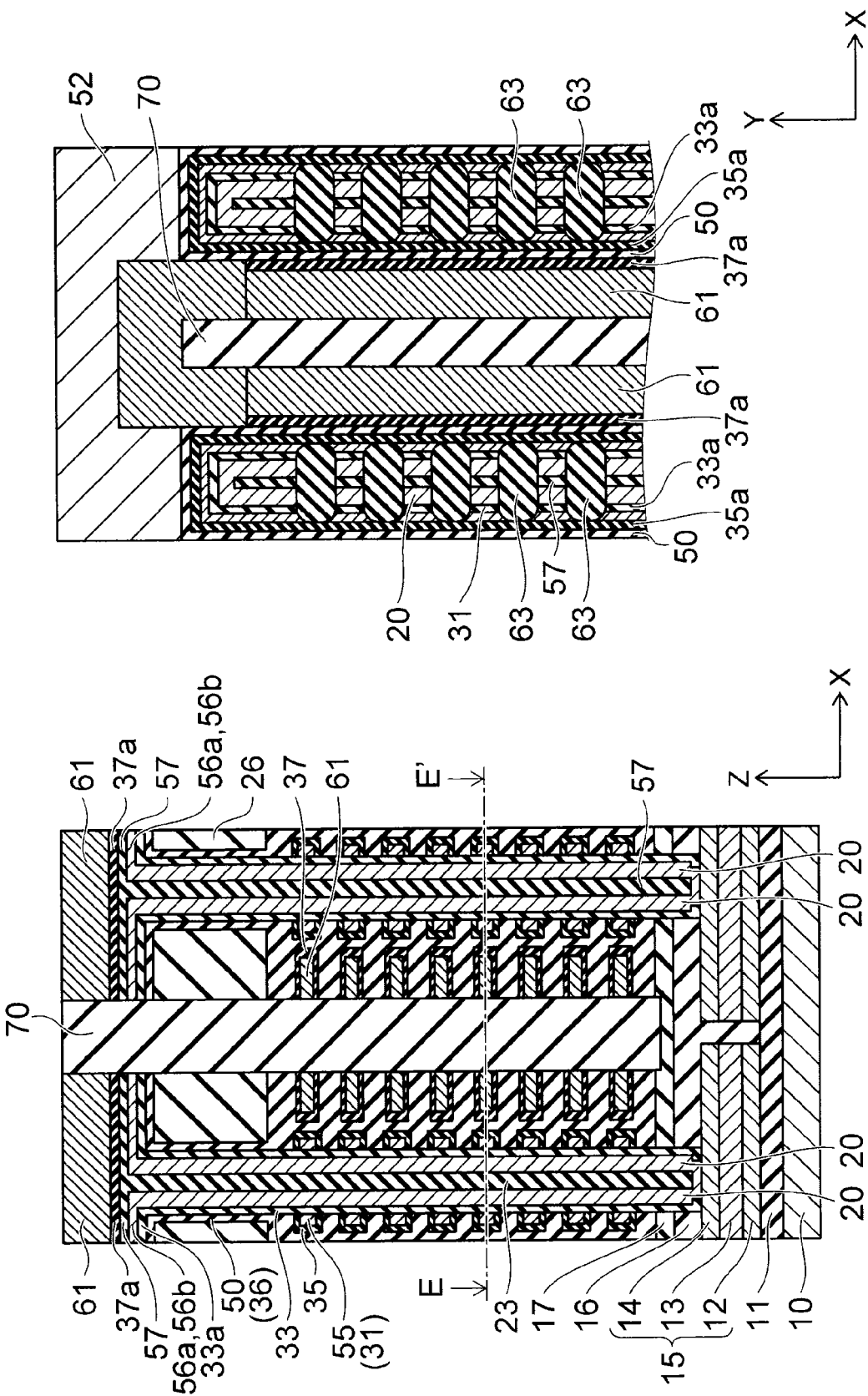

MEMORY DEVICE AND METHOD FOR MANUFACTURING THE SAME

CROSS-REFERENCE TO RELATED APPLICATIONS

This application is based upon and claims the benefit of priority from Provisional Application No. 62/048,057, filed on Sep. 9, 2014; the entire contents of which are incorporated herein by reference.

FIELD

Embodiment described herein relates to a memory device and method for manufacturing same.

BACKGROUND

In the related art, the bit cost of a NAND-type flash memory was reduced by increasing a degree of integration by miniaturizing the planar structure thereof. In recent years, a technology for further increasing the degree of integration by three-dimensionally stacking memory cells has been suggested. In such a stacked memory device, when the degree of integration is further increased, how to lead out wiring from the memory cell and connect the wiring to an external circuit or a peripheral circuit becomes an issue.

BRIEF DESCRIPTION OF THE DRAWINGS

FIG. 3A is a cross-sectional view which illustrates the memory device according to the embodiment and is taken along line B-B' of FIG. 2A.

FIG. 3B is an enlarged cross-sectional view of the memory element of part D of FIG. 3A.

FIG. 8A is a cross-sectional view illustrating the method for manufacturing the memory device according to the embodiment.

FIG. 8B is a cross-sectional view which illustrates the method for manufacturing the memory device according to the embodiment and is taken along line E-E' of FIG. 8A.

FIG. 11A is a cross-sectional view illustrating the method for manufacturing the memory device according to the embodiment.

FIG. 11B is a cross-sectional view which illustrates the method for manufacturing the memory device according to the embodiment and is taken along line E-E' of FIG. 11A.

FIG. 12A is a cross-sectional view illustrating the method for manufacturing the memory device according to the embodiment.

FIG. 12B is a cross-sectional view which illustrates the method for manufacturing the memory device according to the embodiment and is taken along line E-E' of FIG. 12A.

FIG. 13A is a cross-sectional view illustrating the method for manufacturing the memory device according to the embodiment.

FIG. 13B is a cross-sectional view which illustrates the method for manufacturing the memory device according to the embodiment and is taken along line E-E' of FIG. 13A.

FIG. 14A is the cross-sectional view illustrating the method for manufacturing the memory device according to the embodiment.

FIG. 14B is a cross-sectional view which illustrates the method for manufacturing the memory device according to the embodiment and is taken along line E-E' of FIG. 14A.

FIG. 15A is a cross-sectional view illustrating the method for manufacturing the memory device according to the embodiment.

FIG. 15B is a cross-sectional view which illustrates the method for manufacturing the memory device according to the embodiment and is taken along line E-E' of FIG. 15A.

FIG. 18A is a cross-sectional view illustrating the method for manufacturing the memory device according to the embodiment.

FIG. 18B is a cross-sectional view which illustrates the method for manufacturing the memory device according to the embodiment and is taken along line E-E' of FIG. 18A.

FIG. 19A is a cross-sectional view illustrating the method for manufacturing the memory device according to the embodiment.

FIG. 19B is a cross-sectional view which illustrates the method for manufacturing the memory device according to the embodiment and is taken along line E-E' of FIG. 19A.

FIG. 20A is a cross-sectional view illustrating the method for manufacturing the memory device according to the embodiment.

FIG. 20B is a cross-sectional view which illustrates the method for manufacturing the memory device according to the embodiment and is taken along line E-E' of FIG. 20A.

FIG. 22A is a cross-sectional view illustrating the method for manufacturing the memory device according to the embodiment.

FIG. 22B is a cross-sectional view which illustrates the method for manufacturing the memory device according to the embodiment and is taken along line E-E' of FIG. 22A.

FIG. 24A is a cross-sectional view which illustrates the method for manufacturing the memory device according to the embodiment and is taken along line F-F' of FIG. 24C.

FIG. 24B is a cross-sectional view which illustrates the method for manufacturing the memory device according to the embodiment and is taken along line G-G' of FIG. 24C.

FIG. 24C is a cross-sectional view which illustrates the method for manufacturing the memory device according to the embodiment and is taken along line E-E' of FIG. 24A and FIG. 24B.

FIG. 25A is a cross-sectional view which illustrates the method for manufacturing the memory device according to the embodiment and is taken along line F-F' of FIG. 25C.

FIG. 25B is a cross-sectional view which illustrates the method for manufacturing the memory device according to the embodiment and is taken along line G-G' of FIG. 25C.

FIG. 25C is a cross-sectional view which illustrates the method for manufacturing the memory device according to the embodiment and is taken along line E-E' of FIG. 25A and FIG. 25B.

FIG. 26A is a cross-sectional view which illustrates the method for manufacturing the memory device according to the embodiment and is taken along line F-F' of FIG. 26C.

FIG. 26B is a cross-sectional view which illustrates the method for manufacturing the memory device according to the embodiment and is taken along line G-G' of FIG. 26C.

FIG. 26C is a cross-sectional view which illustrates the method for manufacturing the memory device according to the embodiment and is taken along line E-E' of FIG. 26A and FIG. 26B.

FIG. 28A is a cross-sectional view illustrating the method for manufacturing the memory device according to the embodiment.

FIG. 28B is a cross-sectional view which illustrates the method for manufacturing the memory device according to the embodiment and is taken along line E-E' of FIG. 28A.

DETAILED DESCRIPTION

According to an embodiment, a semiconductor memory device includes a semiconductor pillar, first electrode film, second electrode film, first insulating film, second insulating film, and wiring film. The semiconductor member is extending in a first direction in a memory cell region, arranging the semiconductor members in the form of a matrix along a second direction crossing the first direction and along a third direction crossing the first direction and the second direction. The first electrode film is disposed at the lateral side of the semiconductor member in a state of being separated from the semiconductor member. The second electrode film is provided between the semiconductor member and the first electrode film. The first insulating film is provided between the semiconductor member and the second electrode film. The second insulating film is provided between the second electrode film and the first electrode film. The wiring film is disposed in a wiring lead-out region adjacent to the memory cell region. And the first electrode film is formed of a material different from a material of the wiring film, and being electrically connected to the wiring film.

Various embodiments will be described hereinafter with reference to the accompanying drawings.

Embodiments

The embodiments will be described.

Figure 1:
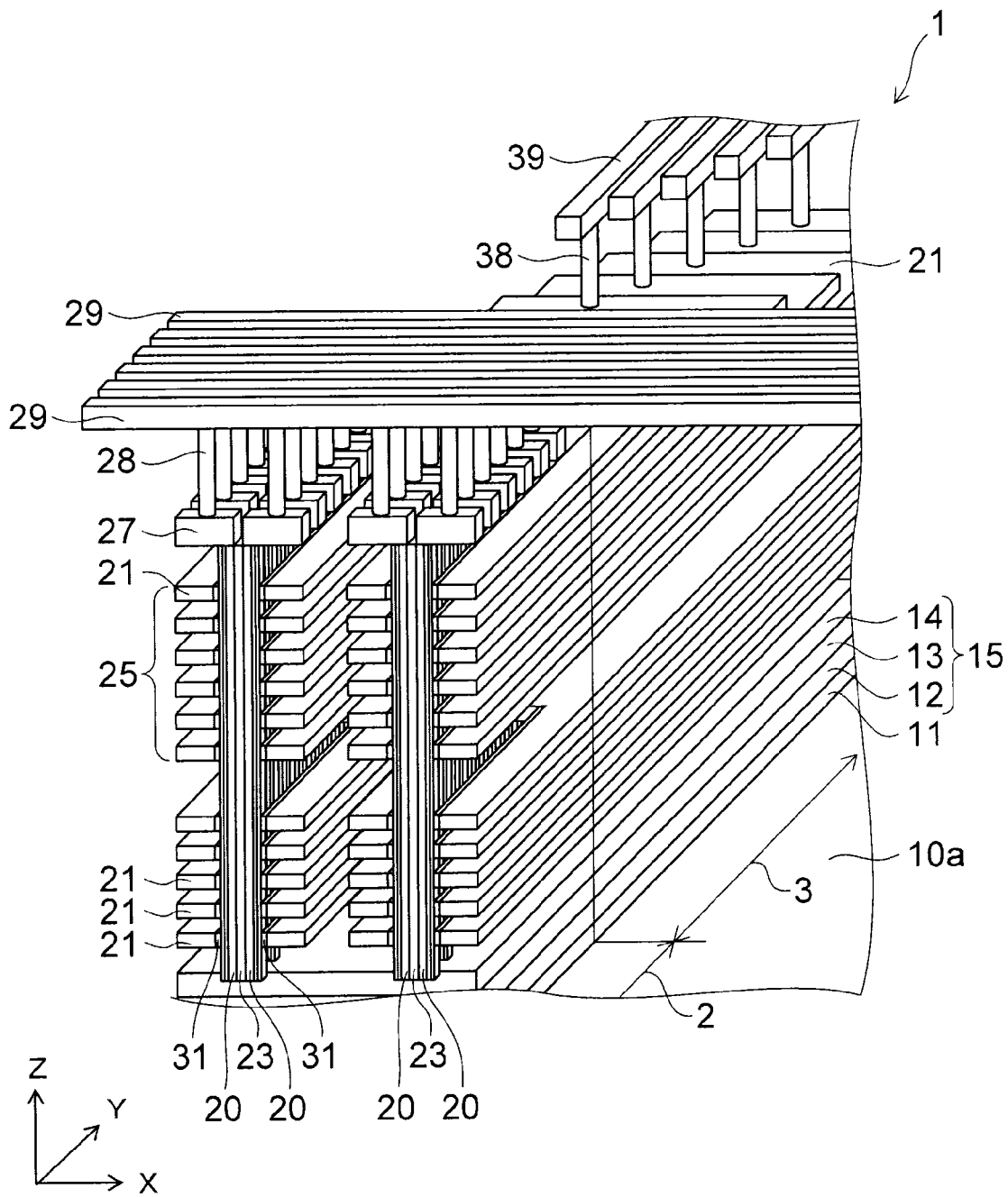
FIG. 1 is a perspective view illustrating a memory device according to an embodiment.

FIG. 1 is a perspective view illustrating a memory device according to an embodiment.

Figures 2A, 2B:
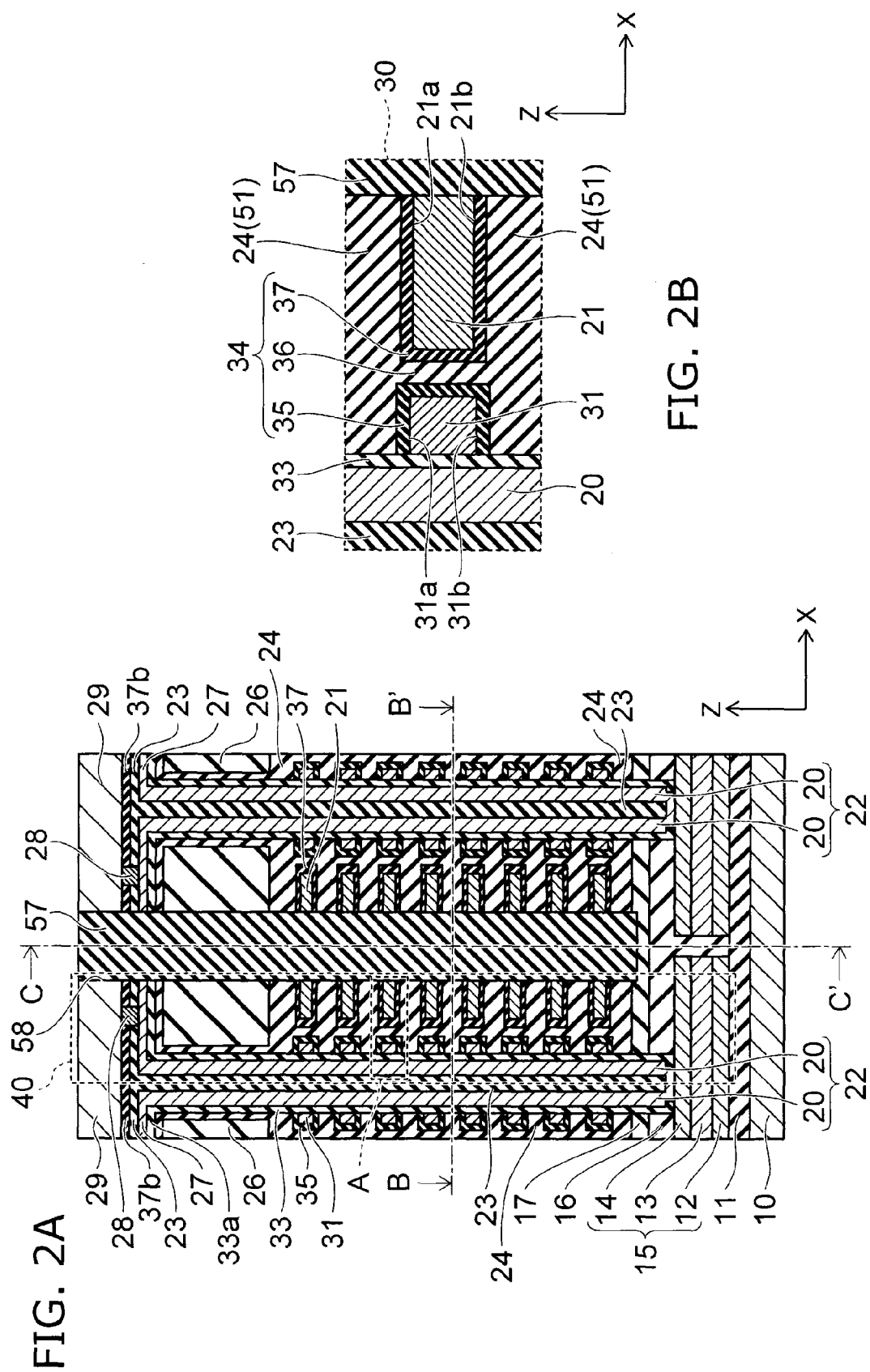
FIG. 2A is a cross-sectional view which illustrates the memory device according to the embodiment and shows a face in parallel with the XZ-plane in a memory cell region of FIG. 1.
FIG. 2B is an enlarged cross-sectional view of a memory element of part A of FIG. 2A.

FIG. 2A is a cross-sectional view which illustrates the memory device according to the embodiment and shows a face in parallel with the XZ-plane in a memory cell region of FIG. 1.

FIG. 2B is an enlarged cross-sectional view of a memory element of part A of FIG. 2A.

FIG. 3A is a cross-sectional view which illustrates the memory device according to the embodiment and is taken along line B-B' of FIG. 2A.

FIG. 3B is an enlarged cross-sectional view of the memory element of part D of FIG. 3A.

Figure 4:
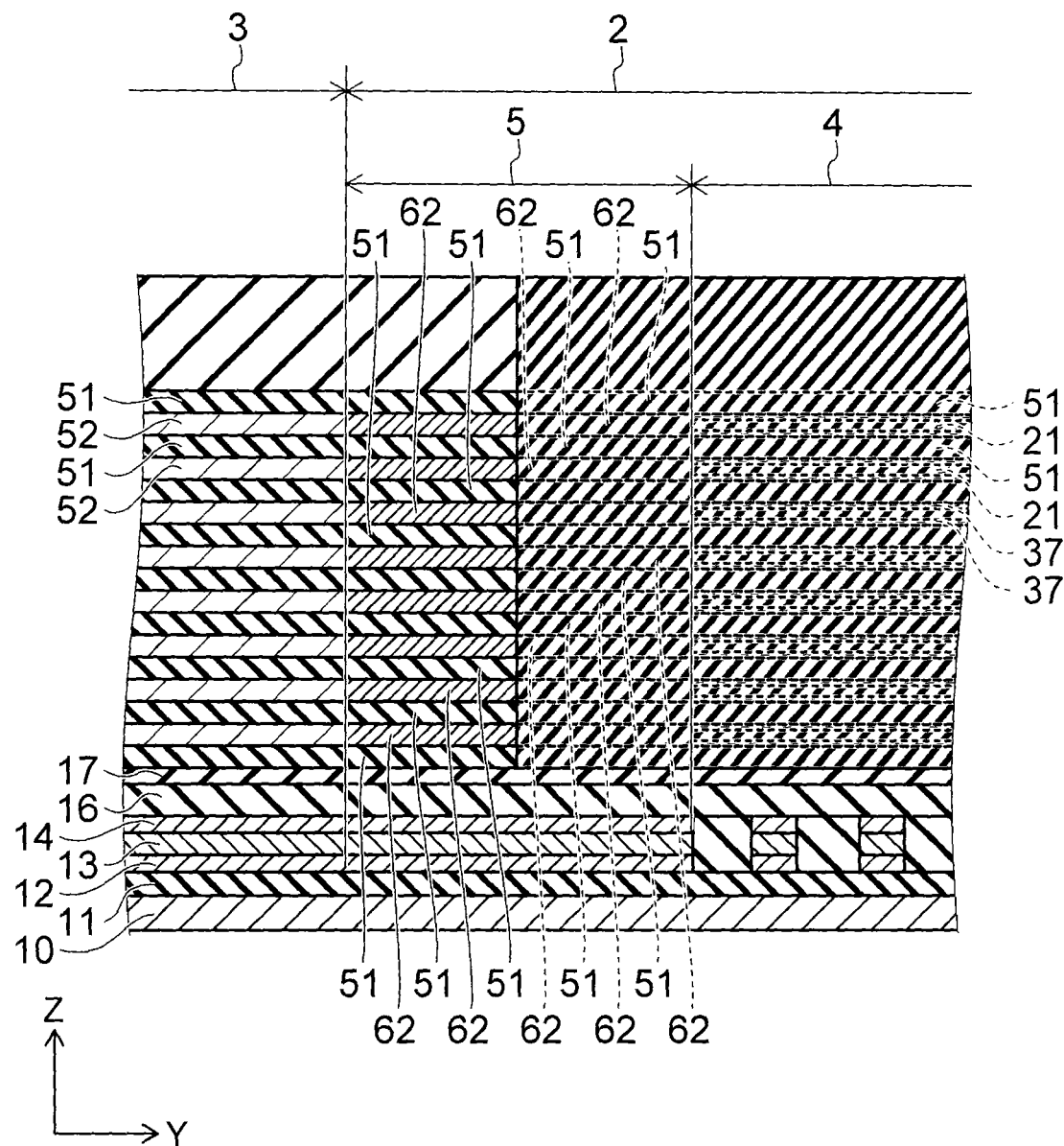
FIG. 4 is a cross-sectional view which illustrates the memory device according to the embodiment and is taken along line C-C' of FIG. 2A.

FIG. 4 is a cross-sectional view which illustrates the memory device according to the embodiment and is taken along line C-C' of FIG. 2A.

Figure 5:
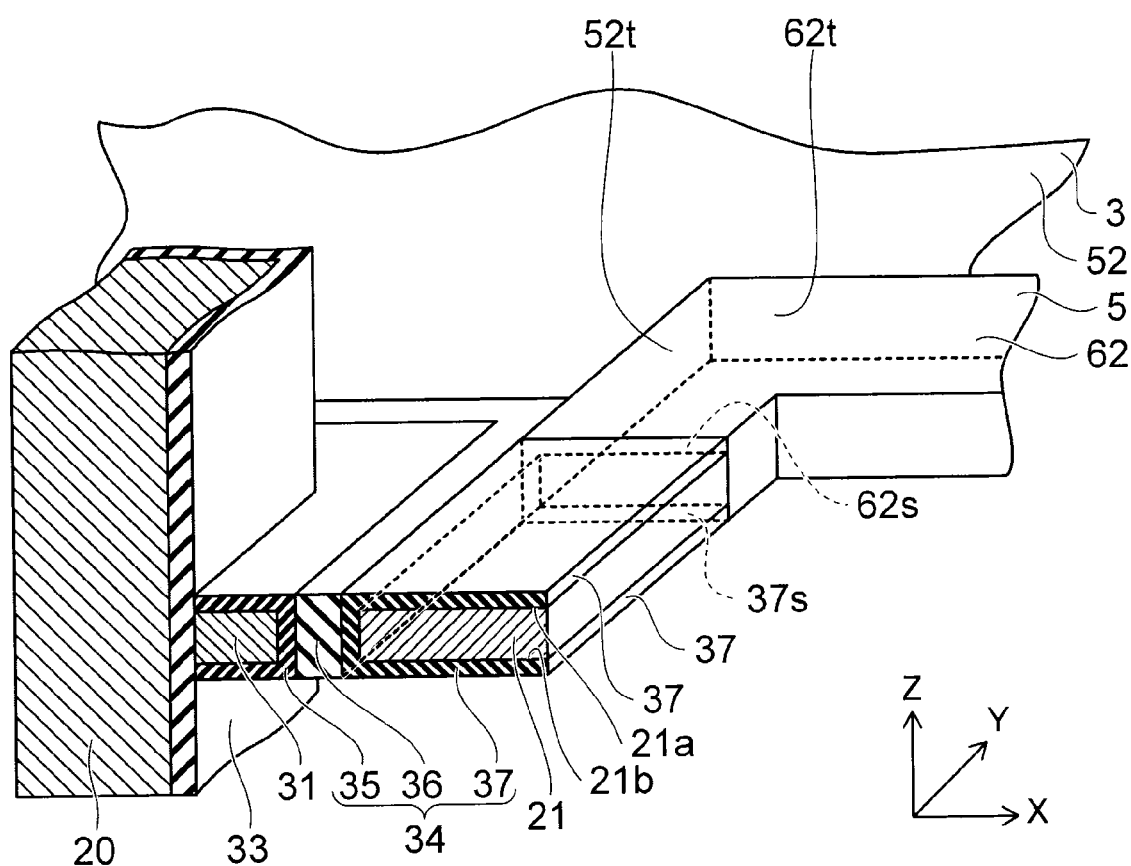
FIG. 5 is a perspective view illustrating the memory cell region and a wiring lead-out region of the memory device according to the embodiment.

FIG. 5 is a perspective view illustrating the memory cell region and a wiring lead-out region of the memory device according to the embodiment.

Figure 6:
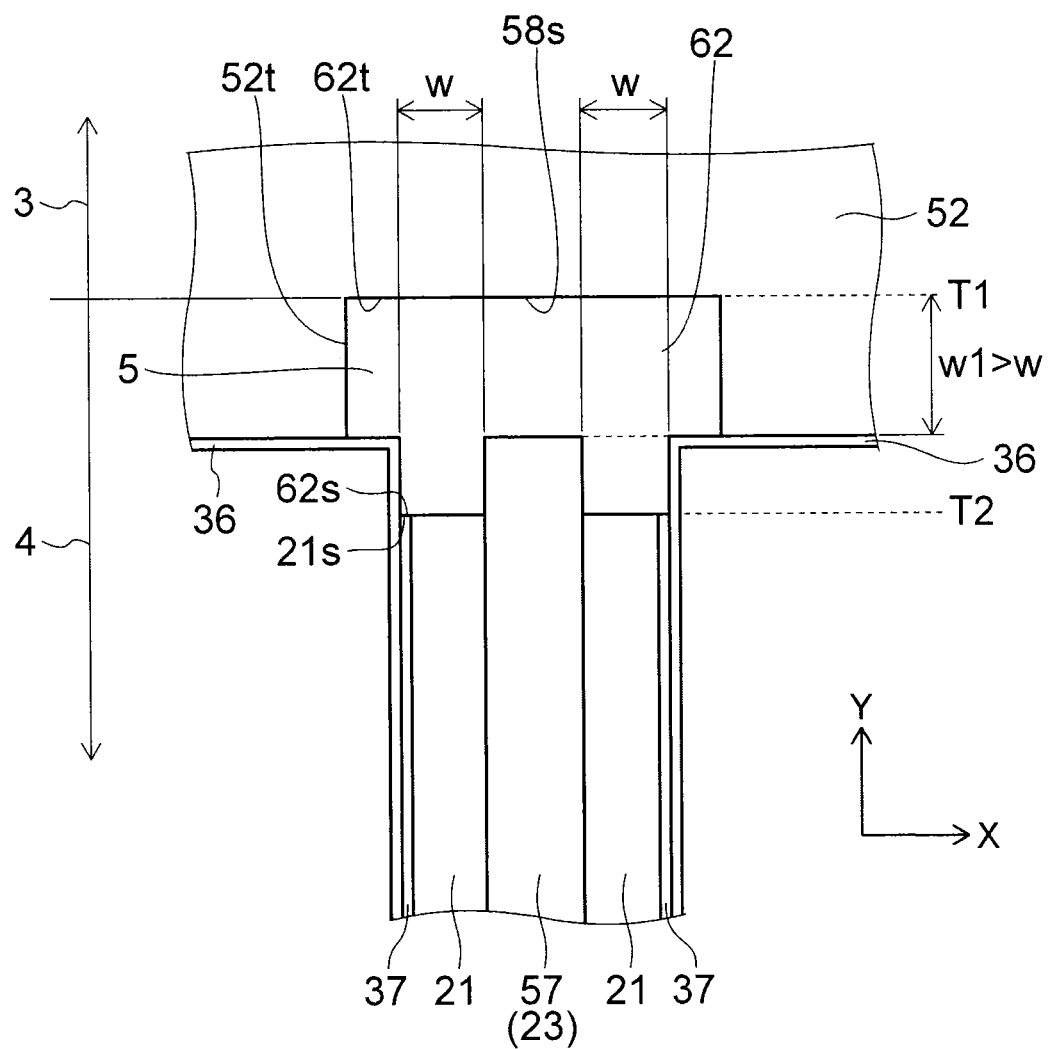
FIG. 6 is a plan view illustrating the planer shape of the memory cell region and the wiring lead-out region of the memory device according to the embodiment.

FIG. 6 is a plan view illustrating the planer shape of the memory cell region and the wiring lead-out region of the memory device according to the embodiment.

As shown in FIG. 1, a semiconductor memory device 1 according to the embodiment is provided with a silicon substrate 10. A memory cell region 2 and a wiring lead-out region 3 are set in the silicon substrate 10. Hereinafter, for convenience of description, in the specification, an XYZ cartesian coordinate system is used in some cases. In the XYZ cartesian coordinate system, two directions, which are parallel to a top surface 10a of the silicon substrate 10 and orthogonal to each other, are called an "X-direction" and a "Y-direction", and a direction perpendicular to the top surface 10a is called a "Z-direction".

In the memory cell region 2, memory elements are three-dimensionally arranged. The wiring lead-out region 3 provided in the semiconductor memory device 1 is adjacent to the memory cell region 2, and has a structure in which wiring is led out from the memory elements on the memory cell region 2.

First, the memory cell region 2 will be described.

As shown in FIG. 1 and FIG. 2A, in the memory cell region 2, an insulating film 11, a conductive layer 12, a wiring layer 13, and a conductive layer 14 are stacked on the silicon substrate 10 in this order. For instance, the insulating film 11 is formed of silicon oxide; the conductive layers 12 and 14 are formed of polysilicon; and the wiring layer 13 is formed of tungsten (W). A cell source line 15 is formed by the conductive layer 12, the wiring layer 13, and the conductive layer 14. On the cell source line 15, insulating films 16 and 17, which are formed of, for example, silicon oxide, are provided in this order. On the cell source line 15, a plurality of silicon pillars 20 extending in the Z-direction is provided. The silicon pillars 20 are made of, for example, polysilicon, and the lower ends thereof penetrate the insulating films 16 and 17 and are connected to the cell source line 15. When seen in the Z-direction, the silicon pillars 20 are arranged in the form of a matrix along the X-direction and the Y-direction, and are connected to the single cell source line 15 altogether. At the lower ends of the silicon pillars 20, the silicon pillars 20 adjacent to each other may be connected to each other, or alternatively, the lower end of each of the silicon pillars 20 may be connected to the conductive layer 14.

At the lateral side of the silicon pillars 20, a plurality of control gate electrode films (first electrode films) 21 is provided in a state of being mutually separated along the Z-direction. Each of the control gate electrode films 21 is made of, for example, tungsten (W) or nickel silicide (NiSi), and extends in the Y-direction. Accordingly, between the silicon pillars 20 disposed along the Y-direction, the control gate electrode films 21 are not disposed. Moreover, in the X-direction, two silicon pillars 20 and two control gate electrode films 21 are alternately arranged. In other words, they form the following structure. The silicon pillars 20 arranged along the X-direction are grouped into a plurality of groups 22 including two silicon pillars 20 adjacent to each other. Between the two groups 22 adjacent to each other, two control gate electrode films 21 are disposed. However, between two silicon pillars 20 belonging to each group 22, the control gate electrode films 21 are not disposed.

Between the silicon pillars 20 forming the group 22, an interlayer insulating film 23 is provided. Between the control gate electrode films 21 adjacent to each other in the Z-direction, at the lower side of the control gate electrode film 21 as a lowermost layer, and at the upper side of the control gate electrode film 21 as an uppermost layer, an interlayer insulating film 24 made of, for example, silicon oxide is provided. On the interlayer insulating film 24 as an uppermost layer, a hard mask 26 is provided.

The silicon pillars 20 are led out to the top of the hard mask 26 and are integrated with wiring 27 extending in the X-direction. Consequentially, the silicon pillars 20 arranged along the X-direction are connected to the common wiring 27. On the wiring 27, insulating films 33a and 37b are formed, and vias 28 penetrating the insulating films 33a and 37b are provided. On the vias 28, a bit-line 29 extending in the X-direction is provided. The bit-line 29 is connected to the wiring 27 through the vias 28. In this manner, each of the silicon pillars 20 is connected between the bit-line 29 and the cell source line 15. That is, the semiconductor memory device 1 is an I pillar-type stacked memory device.

In the memory cell region 2, each of trenches 58 filled with an insulating layer 57 is formed between the groups 22 adjacent to each other in the X-direction. The control gate electrode films 21 of the groups 22 adjacent to each other are separated from each other by the insulating layer 57 that fills each of the trenches 58. Herein, as described later, the control gate electrode film 21 is formed so as to surround the periphery of the trench 58 in the XY-plane, and the control gate electrode film 21s of the groups 22 adjacent to each other can be electrically connected to each other by a metal film or a conductive film formed of the same material as the control gate electrode films 21.

As shown in FIG. 2B, FIG. 3A, and FIG. 3B, between each of the silicon pillars 20 and each of the control gate electrode films 21, a floating gate electrode film 31 (second electrode film) made of, for example, polysilicon, is provided. The floating gate electrode film 31 is provided to each of crossing points of each of the silicon pillars 20 and each of the control gate electrode films 21. Accordingly, the floating gate electrode films 31 are arranged in the form of matrix in a state of being mutually separated in the Y-direction and the Z-direction. Herein, when seen in the Z-direction, each of the floating gate electrode films 31 may be in the form of a fan widening toward the control gate electrode film 21 as shown FIG. 3B. In this case, in the Y-direction, the length of the end of the floating gate electrode film 31 that faces the silicon pillar 20 side is shorter than the length of the end of the floating gate electrode film 31 that faces the control gate electrode film 21 side.

Between each of the silicon pillars 20 and each of the floating gate electrode films 31, a tunnel insulating film 33 made of, for example, silicon oxide is provided. The tunnel insulating film 33 is provided for each of the silicon pillars 20, is in the form of a belt which takes the X-direction as a thickness direction and the Y-direction as a width direction, and extends in the Z-direction.

Between each of the floating gate electrode films 31 and each of the control gate electrode films 21, a block insulating film 34 is provided. The block insulating film 34 is, for example, a three-layered film in which a silicon nitride layer 35, a silicon oxide layer 36, and a silicon nitride layer 37 are stacked on each other in this order, from the floating gate electrode film 31 side to the control gate electrode film 21 side. The silicon nitride layer 35 is formed to surround the floating gate electrode film 31 and covers an upper surface 31a and a lower surface 31b of the floating gate electrode film 31. Furthermore, the silicon oxide layer 36 and the silicon nitride layer 37 are formed to surround the control gate electrode film 21 and cover an upper surface 21a and a lower surface 21b of the control gate electrode film 21.

Normally, the tunnel insulating film 33 stays insulative. However, when voltage within a range of a driving voltage of the semiconductor memory device 1 is applied thereto, tunnel currents flow through the tunnel insulating film 33. The block insulating film 34 is a film in which currents substantially do not flow even when voltage within a range of the driving voltage of the semiconductor memory device 1 is applied thereto. An electric film thickness (EOT) of the tunnel insulating film 33 is greater than an electric film thickness of the block insulating film 34, and a dielectric constant of the tunnel insulating film 33 is lower than a dielectric constant of the block insulating film.

In this way, a memory element 30 is formed at each of the crossing points of each of the silicon pillars 20 and each of the control gate electrode films 21. Each of the memory elements 30 includes the silicon pillar 20, the control gate electrode film (first electrode film) 21, the floating gate electrode film (second electrode film) 31, the tunnel insulating film (first insulating film) 33, and the block insulating film (second insulating film) 34. As shown in FIG. 2A, each of the silicon pillars 20 is shared by memory elements 30 arranged in the Z-direction. The memory elements 30 are disposed in the Z-direction in a state of being separated from each other, and form a memory element string 40. Due to the voltage applied to the control gate electrode films 21 and the voltage applied to both ends of the silicon pillars 20 and depending on whether or not the floating gate electrode films 31 carry charge, the silicon pillars 20 form channels and allow charge to flow in the channels. In the semiconductor memory device 1, the voltage within a range of the driving voltage of the semiconductor memory device 1 is applied to the control gate electrode films 21, such that the charge flowing in the channels can flow as tunnel currents through the tunnel insulating films 33, and the charge can be injected into the floating gate electrode films 31. Furthermore, the charge injected into the floating gate electrode films 31 can be drawn from the floating gate electrode films 31 to the silicon pillars 20, which function as channels, through the tunnel insulating films. In this way, the memory elements 30 can store data in a non-volatile manner and can erase the data.

The memory element strings 40 are arranged in the form of a lattice within the XY-plane on the silicon substrate 10, and thus the memory elements 30 are three-dimensionally arranged. Accordingly, a degree of integration per unit area of the silicon substrate 10 can be increased. Typically, a storage unit of one bit is assigned to each of the memory elements 30. However, by causing each of the memory elements 30 to store plural values, a storage unit of not less than 3-level can be assigned to each of the memory elements 30. In this way, a degree of integration can be substantially further increased.

In the above description, the interlayer insulating film 23 is disposed between the silicon pillars 20 forming the group 22. However, the silicon pillars 20 may be integrally formed. Moreover, the wirings 27, to which the upper end portions of the silicon pillars 20 are connected, may be integrally formed for each of the silicon pillar groups 22.

As shown in FIG. 4, the memory cell region 2 includes a connection portion 5 so as to connect the control gate electrode films 21 to wiring films of the wiring lead-out region 3. Herein, in the memory cell region 2, a region which is not included in a connection portion 5 and in which the memory elements 30 are three-dimensionally arranged is called a memory cell arrangement portion 4.

The connection portion 5 is provided in a state of being adjacent to the memory cell arrangement portion 4 in which the memory elements 30 are three-dimensionally arranged. In the connection portion 5, the insulating film 11, the conductive layer 12, the wiring layer 13, and the conductive layer 14 are stacked on the silicon substrate 10 in this order, and the cell source line 15 is formed by the conductive layer 12, the wiring layer 13, and the conductive layer 14. The top of the cell source line 15 is covered with the insulating films 16 and 17. In the connection portion 5, silicon oxide films 51 and connection wiring films 62 are alternately stacked on each other on the insulating films 16 and 17. The connection wiring films 62 are made of, for example, W or NiSi, CoSi, or MoSi obtained by silicidating polysilicon, and are formed of the same material as the control gate electrode films 21. The upper and lower surfaces of each of the control gate electrode films 21 of the memory cell arrangement portion 4 are covered with the block insulating film 34. Each of the control gate electrode films 21 is stacked on the silicon oxide layer 51 via the block insulating film 34. In contrast, in the connection portion 5, each of the connection wiring films 62 is directly stacked on the silicon oxide layer 51 without being covered with the block insulating film or the like.

Next, the wiring lead-out region 3 will be described.

The wiring lead-out region 3 includes a region for leading out wiring that drives the control gate electrode films 21. Although the periphery of the wiring lead-out region 3 includes a control circuit or the like that sets control logic for performing reading, writing, and erasing on the memory elements 30 of the memory cell region 2, detailed descriptions of the function and structure thereof are skipped herein. Regarding the memory cell region 2, as described above, wiring such as the bit-line 29 is formed on the region in which the memory elements 30 are formed, and the cell source line 15 or the like is formed under the memory elements 30. Although the wirings are lead out from the memory cell region 2 and connected to the control circuit or the like disposed in the outer circumference of the wiring lead-out region 3, detailed descriptions of the structure of the wirings are skipped herein.

As shown in FIG. 3A, FIG. 3B, and FIG. 4, in the wiring lead-out region 3, the insulating film 11, the conductive layer 12, the wiring layer 13, and the conductive layer 14 are stacked in this order on the silicon substrate 10 overlapped with the memory cell region 2, and the cell source line 15 is formed by the conductive layer 12, the wiring layer 13, and the conductive layer 14. The top of the cell source line 15 is covered with the insulating layers 16 and 17. In the wiring lead-out region 3, the silicon oxide films 51 and polysilicon films 52 are alternately stacked on each other on the insulating films 16 and 17. In the wiring lead-out region 3, the memory cell arrangement portion 4, and the connection portion 5, each of the stacked silicon oxide films 51 is formed in the same plane. Furthermore, each of the stacked polysilicon films 52, connection wiring films 62, and control gate electrode films 21 is formed in the same plane. The connection wiring films 62 are electrically connected to each other at the boundary between the wiring lead-out region 3 and the connection portion 5. Because the upper and lower surfaces of each of the connection wiring films 62 are not covered with the block insulating film or the like, the cross-section of each of the polysilicon films 52 and the cross-section of each of the connection wiring films 62 have substantially the same area.

As shown in FIG. 1, in the wiring lead-out region 3, the stacked body including the polysilicon film 52, which is connected to each of the control gate electrode films 21, and the insulating film 51 is processed in the form of a step. In the wiring lead-out region 3, vias 38 are provided which penetrate the polysilicon films 52 of the layer connected to the vias 38. On the vias 38, a word-line 39 extending in the Y-direction is provided. In the Z-direction, the position of the word-line 39 is the same as the position of the bit-line 29. The word-line 39 is connected to the control gate electrode films 21 through the via 38. Herein, the end of the stacked body in the Y-direction is not necessarily processed in the form of a step and may be processed in the form of a wall surface similarly to the other faces. In this way, in the wiring lead-out region 3, the word-line 39 is connected to the control gate electrode films 21 through the vias 38, the polysilicon films 52, and the connection wiring films 62.

Next, the way the memory cell region 2 is electrically connected to the wiring lead-out region 3 through the connection portion 5 will be described.

The connection wiring films 62 of the connection portion 5 are made of substantially the same material as the control gate electrode films 21 of the memory elements 30. However, as shown in FIG. 5, each of the control gate electrode films 21 is covered with the silicon nitride layer 37 of the block insulating film 34 except for the face that contacts the insulating layer 57. Accordingly, the control gate electrode films 21 are electrically connected to the polysilicon films 52 through the connection wiring films 62 that are formed by removing the silicon nitride layer 37. Each of the control gate electrode films 21 is formed by directly depositing a conductive film after forming the silicon nitride layer 37, although the process will be explained in detail in the description of the manufacturing method thereof. In contrast, each of the connection wiring films 62 forms a conductive film at a site from which the formed silicon nitride layer 37 has been removed. More specifically, as shown in FIG. 3A and FIG. 5, the control gate electrode film 21 and the connection wiring film 62 are formed so as to surround the periphery of the trench 58 formed between the groups 22 of the silicon pillars 20 adjacent to each other in the X-direction.

As shown in FIG. 4 and FIG. 5, the upper surface 21a and the lower surface 21b of the control gate electrode film 21 are covered with the silicon nitride layer 37 constituting the block insulating film 34. In contrast, the entire face of the connection wiring film 62 is formed of the same conductive material such as NiSi. Accordingly, if the position of an end 37s of the silicon nitride layer 37 in the Y-direction is regarded as being an imaginary connection position of the connection wiring films 62 and the control gate electrode films 21, in the imaginary connection position, the cross-sectional area of each of the connection wiring films 62 becomes larger than the cross-sectional area of each of the control gate electrode films 21 by the thickness of the silicon nitride layer 37.

At the boundary between the connection portion 5 and the wiring lead-out region 3, an end 62t of the connection wiring film 62 and an end 52t of the polysilicon film 52 are connected to each other with the same cross-sectional area.

For instance, the connection portion 5 is defined by a connection position T1 of the connection portion 5 and the wiring lead-out region 3, and is defined by a connection position T2 of the connection portion 5 and the memory cell arrangement portion 4, and set as below.

The connection position T1 is a position that extends in the forward direction of the Y-direction from an end 58s of the trench 58 formed between the groups 22 adjacent to each other, and has a length not less than a length w in the X-direction from the long side of the trench 58 to the silicon oxide layer 36. The connection position T2 can be set in any position in which the memory element 30 that is closest to the end 58s of the trench 58 in the Y-direction is formed. Accordingly, within a space between the connection position T1 and the connection position T2, the connection portion 5 is formed between the silicon oxide layers 36 of the memory elements 30, which are adjacent to each other in the X-direction while interposing the trench 58 therebetween.

The connection portion 5 can be set as described above for example, but the setting method is not limited thereto. The connection portion 5 just needs to make it possible to establish electrical connection between the end 62t of the connection wiring film 62 and the end 52t of the polysilicon film 52. As explained in the manufacturing method, which will be described later, the connection wiring film 62 of a connection portion 5 is formed in a manner in which a portion of a polysilicon film 52a stacked in advance is removed by a recessing process; polysilicon is newly deposited on a recess formed after the removal of the polysilicon film 52a; and a metal film is deposited thereon and subjected to a thermal treatment for silicidation, or alternatively, a metal material such as W is deposited thereon. Therefore, the connection position T1 is determined by the initial recessing amount (that is, depth of etching) of the polysilicon film 52a. Because the region in which the group 22 of the silicon pillars 20 is formed is surrounded by the silicon oxide layer 36, etching is stopped after being performed up to the position of the silicon oxide layer 36. In contrast, at the side of the connection portion 5, there is no structure that stops etching, and consequentially, the polysilicon film 52a is more deeply etched in some cases. As a result, the depth of the connection wiring film 62 which is to be replaced can be further increased, and as shown in FIG. 6, a distance w1 between the end 58s of the trench 58 and the connection position T1 can be increased compared to a depth w of a recess 59.

As described above, in the memory cell region 2, through the connection wiring film 62 from which the silicon nitride layer 37 has been selectively removed, the control gate electrode film 21 is connected to the polysilicon film 52. For the wiring for the connection wiring film 62, the same material as the control gate electrode films 21 is used. Therefore, for the wiring film of the wiring lead-out region 3, a different material can be used. In the memory cell region 2, a high-conductivity material, such as W or NiSi can be used. Consequentially, low-resistance wiring can be formed, and parasitic capacitance, which results from the increase in capacity caused by connection between a large number of memory elements 30, can be driven. The use of the high-conductivity material makes it possible to decrease the length of the control gate electrode film 21 in the X-direction. As a result, the pitch between the memory elements 30 between the groups 22 adjacent to each other can be reduced, whereby the integration density can be further increased. In the wiring lead-out region 3, the wiring film is formed of polysilicon, hence the via or the like is easily processed over the entire wiring lead-out region 3. Because the connection portion 5 can be freely set, design margins can be increased in accordance with processing accuracy. The connection wiring film 62 in the connection portion 5 is formed by removing the insulating films of the upper and lower surfaces. Therefore, it is possible to realize a low-resistance wiring structure without reducing the cross-sectional area of the face perpendicular to the direction in which currents flow.

Next, a method for manufacturing the semiconductor memory device 1 according to the embodiment will be described.

FIG. 7A to FIG. 22A are cross-sectional views illustrating a method for manufacturing a memory device according to the embodiment.

FIG. 7B to FIG. 22B are cross-sectional views taken along line E-E' of FIG. 7A to FIG. 22A.

FIG. 23A to FIG. 26A are cross-sectional views illustrating the method for manufacturing the memory device according to the embodiment.

FIG. 23B to FIG. 26B are cross-sectional views illustrating the method for manufacturing the memory device according to the embodiment.

FIG. 23C to FIG. 26C are cross-sectional views which illustrate the method for manufacturing the memory device according to the embodiment and are taken along line E-E' of FIG. 23A to FIG. 26A and FIG. 23B to FIG. 26B.

Figures 27A, 27B:
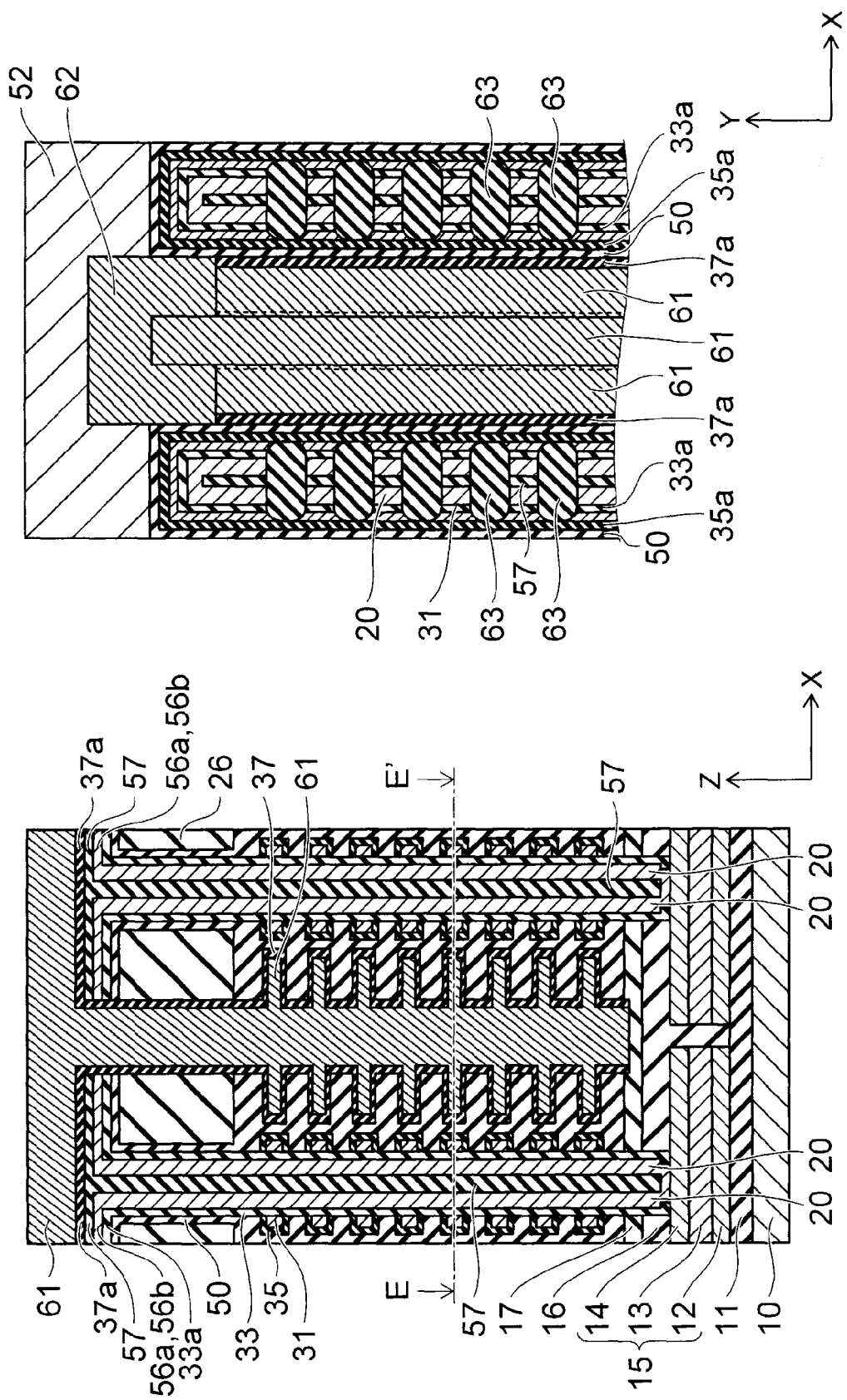
FIG. 27A is a cross-sectional view illustrating the method for manufacturing the memory device according to the embodiment.
FIG. 27B is a cross-sectional view which illustrates the method for manufacturing the memory device according to the embodiment and is taken along line E-E' of FIG. 27A.

FIG. 27A and FIG. 28A are cross-sectional views illustrating the method for manufacturing the memory device according to the embodiment.

FIG. 27B and FIG. 28B are cross-sectional views which illustrate the method for manufacturing the memory device according to the embodiment and are taken along line E-E' of FIG. 27A and FIG. 28A.

Figure 7B:
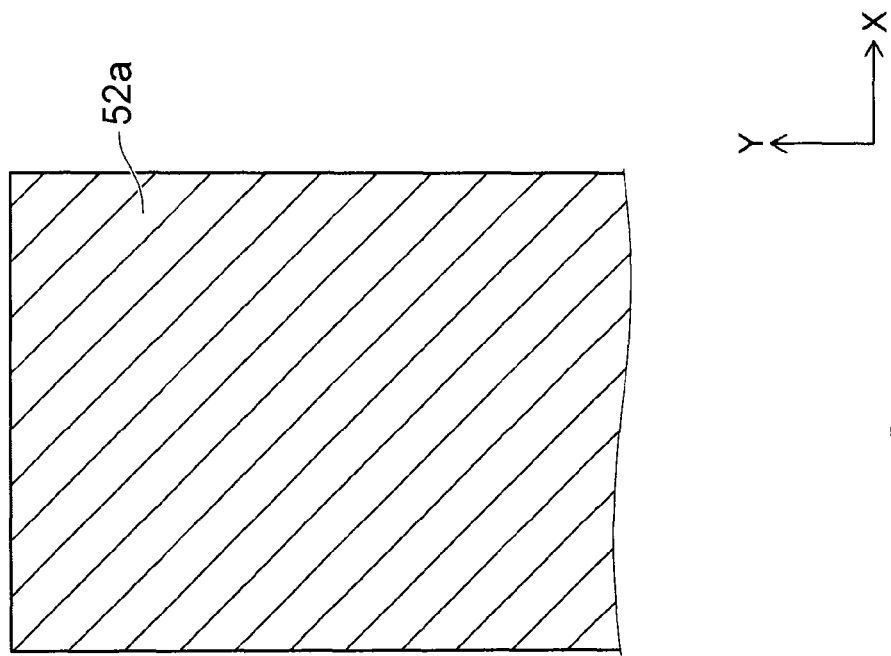
FIG. 7B is a cross-sectional view which illustrates the method for manufacturing the memory device according to the embodiment and is taken along line E-E' of FIG. 7A.
Figure 7A:
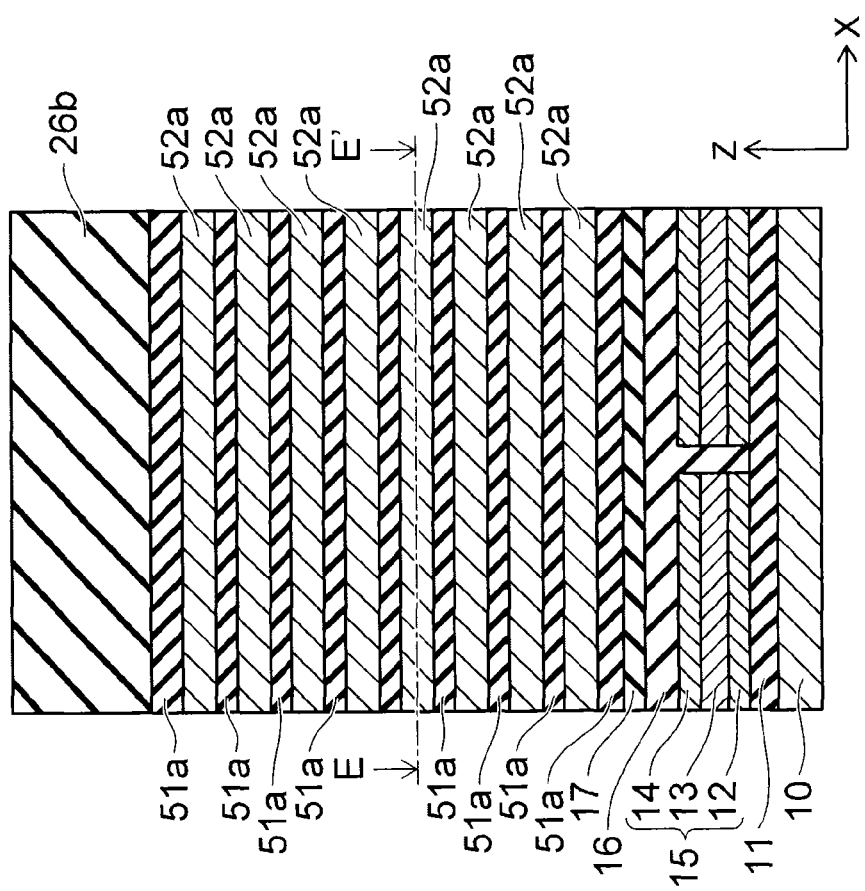
FIG. 7A is a cross-sectional view illustrating a method for manufacturing a memory device according to the embodiment.

As shown in FIG. 7A and FIG. 7B, on the insulating film 11 formed on the silicon substrate 10, the sell source line 15 including the conductive layer 12, the wiring layer 13, and the conductive layer 14 is formed. Moreover, through the insulating layers 16 and 17, interlayer insulating or the like is established, and then a stacked body, in which a plurality of silicon oxide films 51a and polysilicon films 52a are stacked on each other, is formed. On the silicon oxide film 51a as the uppermost layer of the stacked body, a hard mask 26b is formed. The hard mask 26b is formed of, for example, a silicon nitride film.

As shown in FIG. 8A and FIG. 8B, the hard mask 26b is patterned. Trenches 53 are formed in the stacked body through the patterned hard mask 26a as a mask by using an anisotropic etching technology such as reactive ion etching (RIE). The trenches 53 penetrate the insulating layers 16 and 17 and are open until they reach the conductive layer 14. Each of the trenches 53 is open in the form of a rectangle of which the long side extends in the Y-direction.

Figures 9A, 9B:
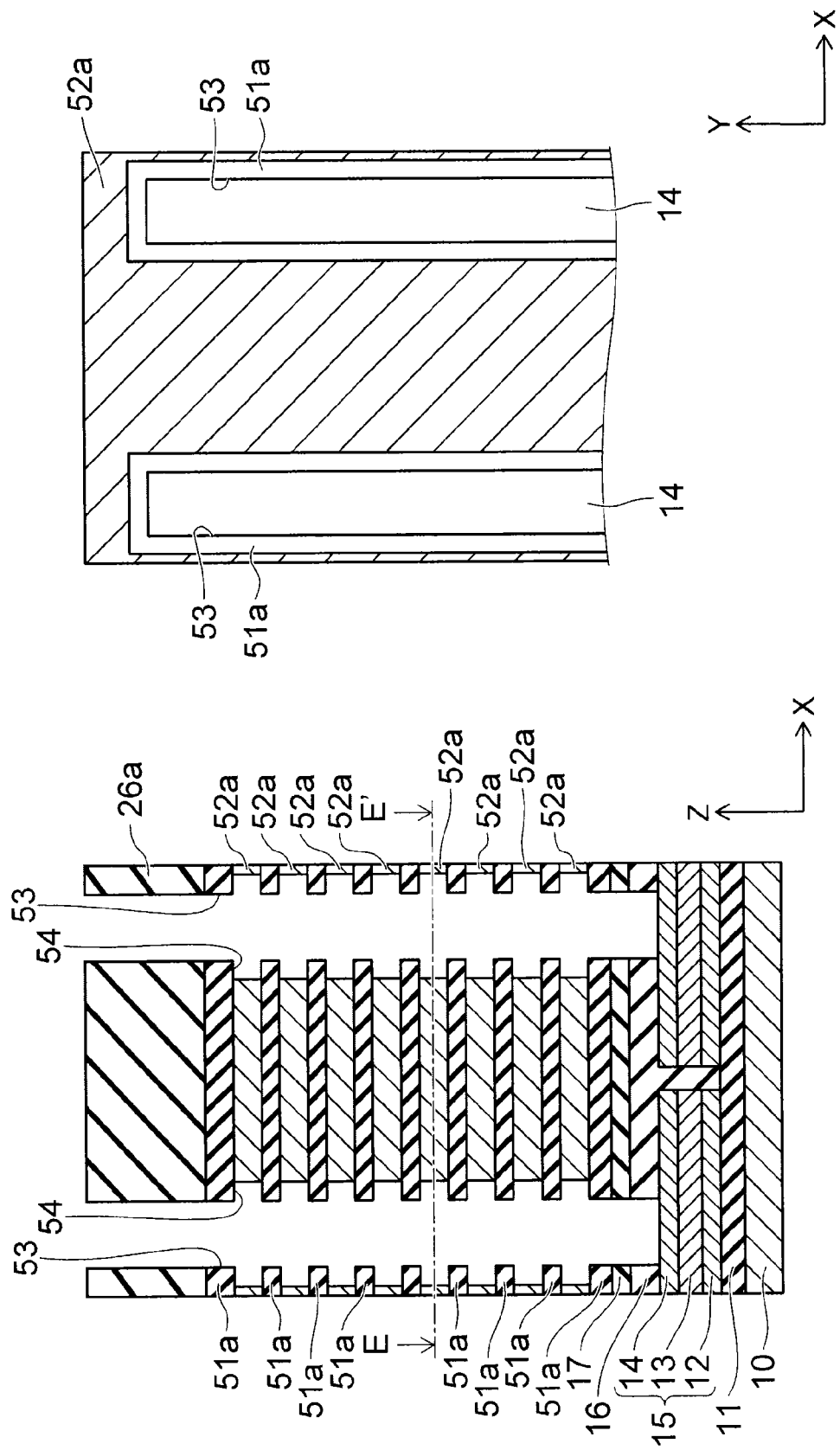
FIG. 9A is a cross-sectional view illustrating the method for manufacturing the memory device according to the embodiment.
FIG. 9B is a cross-sectional view which illustrates the method for manufacturing the memory device according to the embodiment and is taken along line E-E' of FIG. 9A.

As shown in FIG. 9A and FIG. 9B, by performing wet etching, the polysilicon films 52a exposed on the side wall of the trenches 53 are retracted (recessing). In the layer of the recessed polysilicon films 52a, a recess 54 is formed. The recess 54 is formed in a state of surrounding the periphery of each of the trenches 53, for each layer of the polysilicon films 52a.

Figures 10A, 10B:
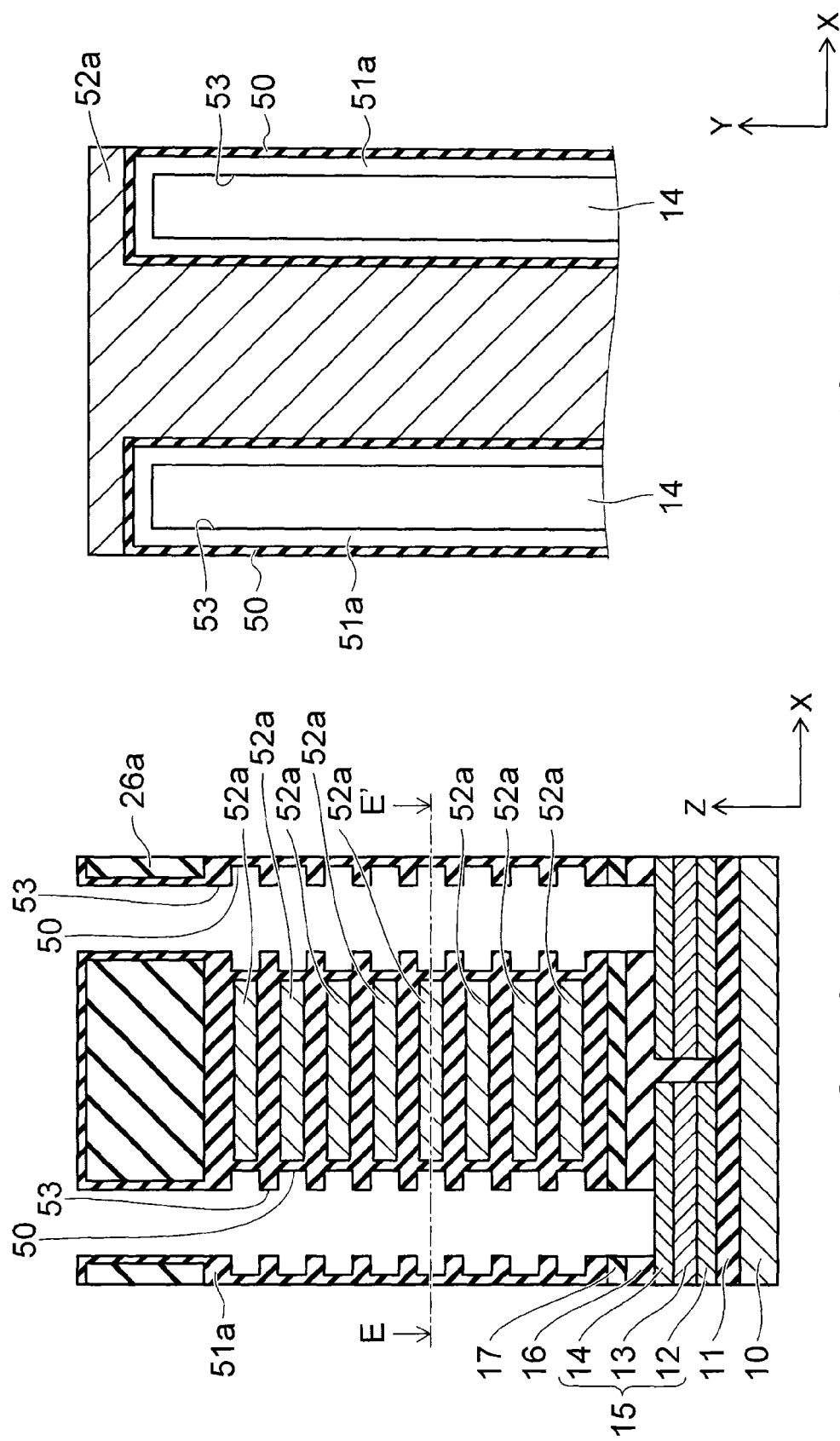
FIG. 10A is a cross-sectional view illustrating the method for manufacturing the memory device according to the embodiment.
FIG. 10B is a cross-sectional view which illustrates the method for manufacturing the memory device according to the embodiment and is taken along line E-E' of FIG. 10A.

As shown in FIG. 10A and FIG. 10B, by using SPA technology or the like, the entire exposed surface is subjected to an oxidation treatment together with the recessed surfaces. The end face of each of the polysilicon films 52a exposed by the recessing is covered with a thin silicon oxide layer 50. Herein, a portion of the silicon oxide layer 50 finally becomes the silicon oxide layer 36 configuring the block insulating film 34.

As shown in FIG. 11A and FIG. 11B, a silicon nitride layer 35a is formed on the entire surface of the resultant. Herein, a portion of the silicon nitride layer 35a finally becomes the silicon nitride layer 35 configuring the block insulating film 34.

As shown in FIG. 12A and FIG. 12B, a polysilicon film 55a is formed on the entire surface covered with the silicon nitride layer 35a.

As shown in FIG. 13A and FIG. 13B, anisotropic etching such as RIE is performed along the trench 53. As a result, the polysilicon film 55a and the silicon nitride layer 35a are selectively removed, and these are left inside the recesses 54. Consequentially, the polysilicon film 55 left inside the recesses 54 adjacent to each other in the Z-direction is divided. Likewise, the silicon nitride layer 35a left inside the recesses 54 adjacent to each other in the Z-direction is also divided. Herein, the polysilicon film 55 left inside the recesses 54 finally becomes the floating gate electrode films 31.

As shown in FIG. 14A and FIG. 14B, the silicon oxide film 33a is formed on the entire surface of the resultant. The silicon oxide film 33a finally becomes the tunnel insulating film 33.

As shown in FIG. 15A and FIG. 15B, a polysilicon film 56a is deposited on the silicon oxide film 33a.

Figures 16A, 16B:
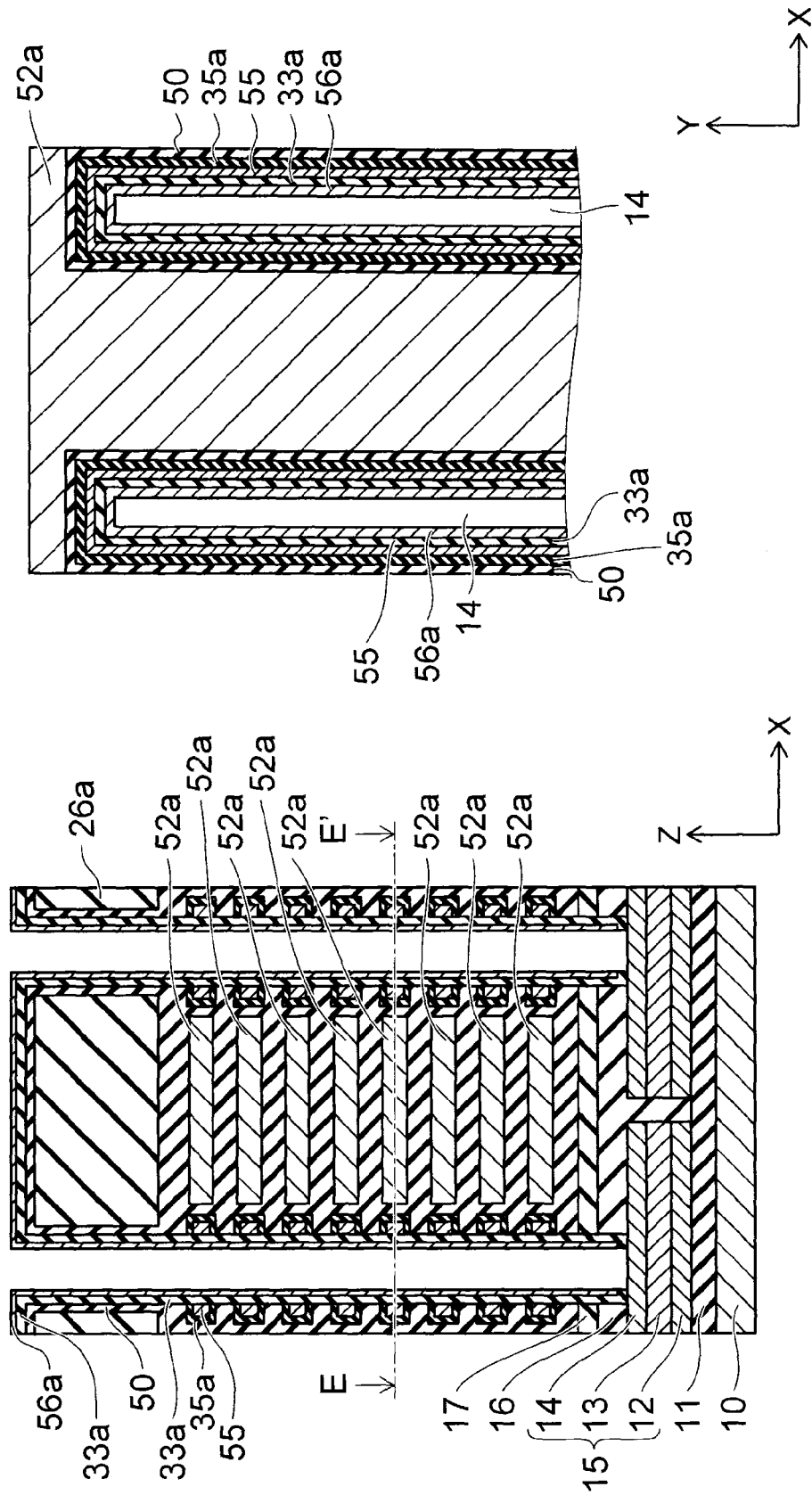
FIG. 16A is a cross-sectional view illustrating the method for manufacturing the memory device according to the embodiment.
FIG. 16B is a cross-sectional view which illustrates the method for manufacturing the memory device according to the embodiment and is taken along line E-E' of FIG. 16A.

As shown in FIG. 16A and FIG. 16B, the silicon oxide film 33a and the polysilicon film 56a deposited on the bottom of the trench 53 are removed by anisotropic etching such as RIE until the conductive layer 14 is exposed.

Figures 17A, 17B:
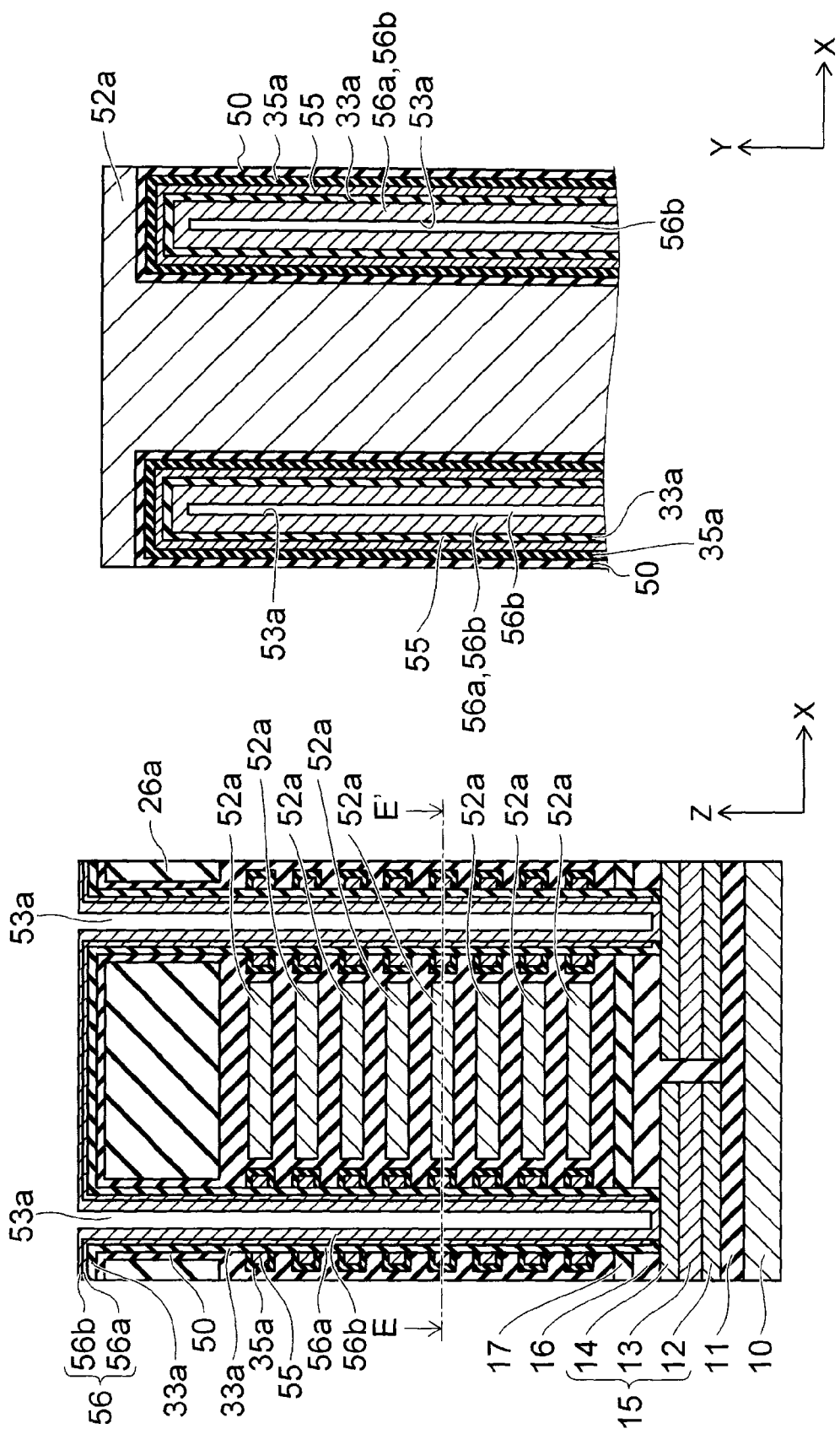
FIG. 17A is a cross-sectional view illustrating the method for manufacturing the memory device according to the embodiment.
FIG. 17B is a cross-sectional view which illustrates the method for manufacturing the memory device according to the embodiment and is taken along line E-E' of FIG. 17A.

As shown in FIG. 17A and FIG. 17B, a polysilicon film 56b is deposited on the entire surface of the resultant, and the lower portion of the polysilicon film 56b is connected to the conductive layer 14. Herein, a polysilicon film 56 including the polysilicon films 56a and 56b is formed of non-doped polysilicon and finally becomes the silicon pillars 20.

In order to form the memory element strings 40 arranged in the Y-direction, the layer of the polysilicon film 56b is divided. In the dividing process for the polysilicon film 56b, if there is a gap 53a due to the trenches, or if the surface of the polysilicon film 56b is rough, stress concentration occurs at the dividing process, and accordingly, the polysilicon film 56b cannot be uniformly divided. Furthermore, when the polysilicon films 56a and 56b function as the silicon pillars 20, if the surfaces thereof are rough, transferability of charge deteriorates. Accordingly, as shown in FIG. 18A and FIG. 18B, an amorphous silicon layer 60 is deposited as a sacrifice layer. Thereafter, the amorphous silicon layer 60 is removed, and the insulating film 57 made of silicon oxide is deposited.

After the filled amorphous silicon layer 60 is removed, the insulating film 57 made of silicon oxide is formed on the entire surface of the resultant so as to fill the gaps 53a. Subsequently, as shown in FIG. 19A and FIG. 19B, by using a hard mask (not shown in the drawing), the polysilicon films 56a and 56b are selectively divided, and the silicon pillars 20 arranged in the Y-direction are formed. By wet etching or the like, the silicon oxide films 33a and the connection wiring films 62 are selectively removed, and the tunnel insulating films 33 and the floating gate electrode films 31 are formed.

As shown in FIG. 20A and FIG. 20B, between the trenches 53, which are filled with the polysilicon films 56a and 56b and the insulating film 57, the trench 58 reaching the insulating film 17 is formed by patterning a hard mask 26a. Similarly to the trenches 53, the trenches 58 are formed into a rectangles of which the long side extends in the Y-direction.

Figures 21A, 21B:
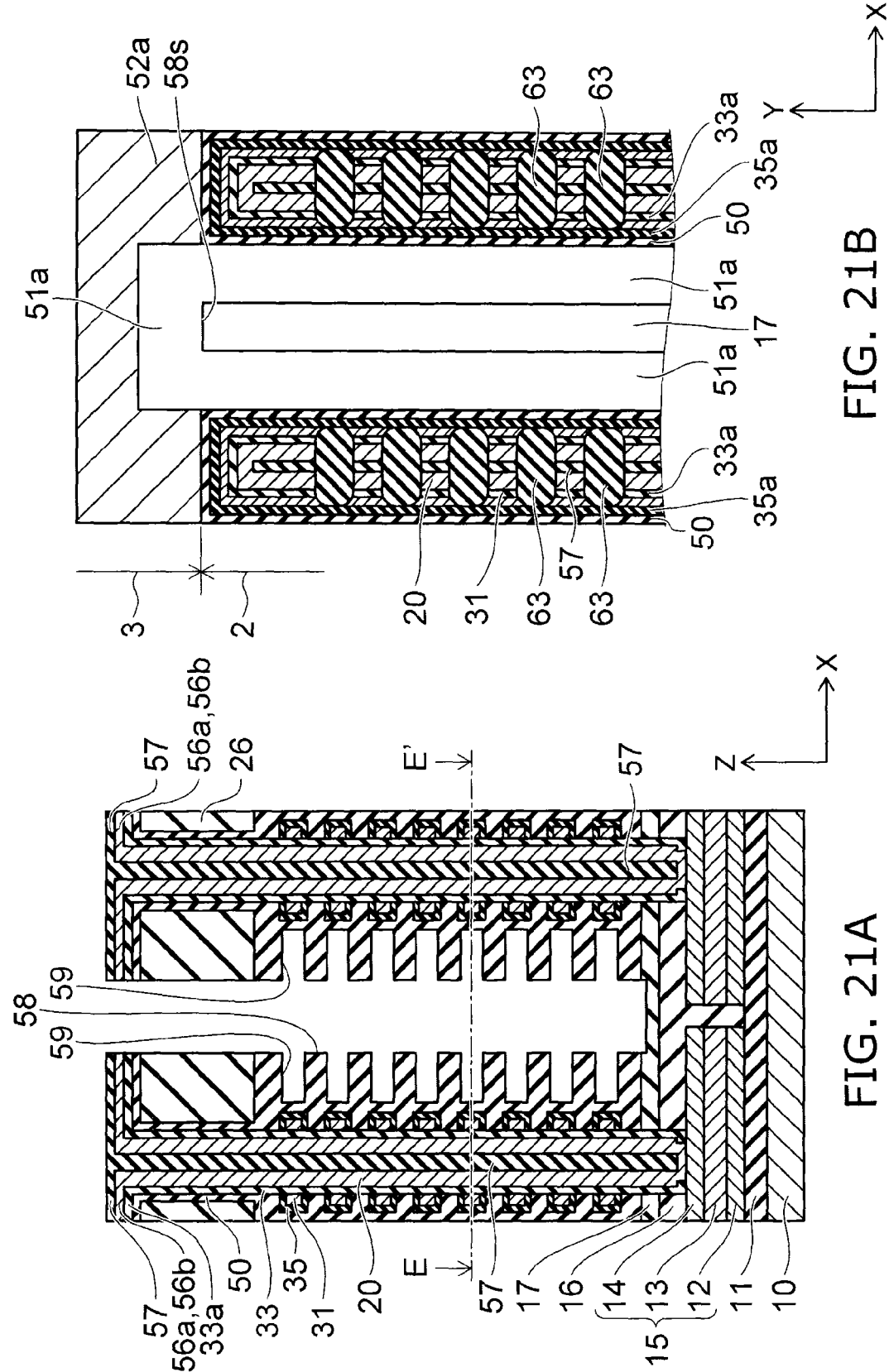
FIG. 21A is a cross-sectional view illustrating the method for manufacturing the memory device according to the embodiment.
FIG. 21B is a cross-sectional view which illustrates the method for manufacturing the memory device according to the embodiment and is taken along line E-E' of FIG. 21A.

As shown in FIG. 21A and FIG. 21B, by performing wet etching using a hot TMY solution, the polysilicon films 52a are recessed through the trenches 58. During the recessing process, in the memory cell region 2, the etching is stopped by the silicon oxide layer 50 exposed in the inner surface of the recess 59. In the wiring lead-out region 3, there is no layer that stops etching, such as the silicon oxide layer 50. Accordingly, by controlling the etching rate or the like, the recesses 59 that have substantially the same depth as the memory cell region 2 are formed. In this way, on the inner side surface of the trench 58, the recess 59 surrounding the periphery of the trench 58 is formed. In the wiring lead-out region 3, by performing the etching more deeply, the depth of the recess 59 of the wiring lead-out region 3 can be increased compared to the depth of the recess 59 of the memory cell region 2. Herein, in this process, being protected by the silicon oxide layer 50, the silicon nitride layer 35 covering the floating gate electrode films 31 is not damaged.

As shown in FIG. 22A and FIG. 22B, a silicon nitride layer 37a is formed on the entire surface of the resultant. The silicon nitride layer 37a finally becomes the silicon nitride layer 37 configuring the block insulating film 34.

Figure 23C:
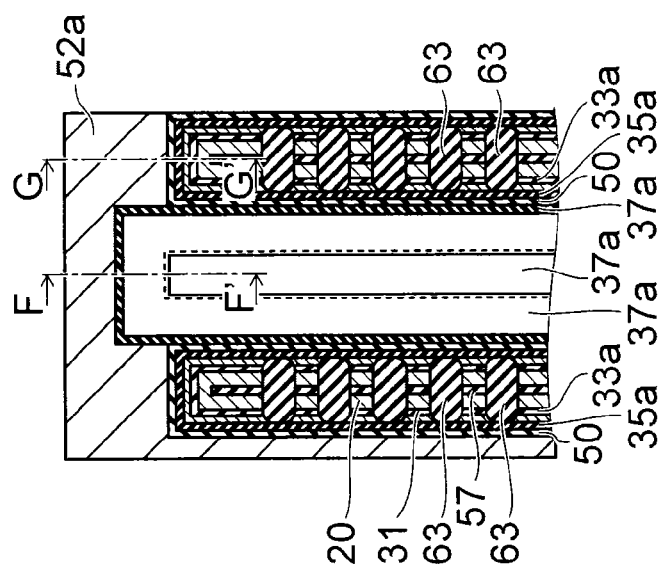
FIG. 23C is a cross-sectional view which illustrates the method for manufacturing the memory device according to the embodiment and is taken along line E-E' of FIG. 23A and FIG. 23B.
Figure 23A:
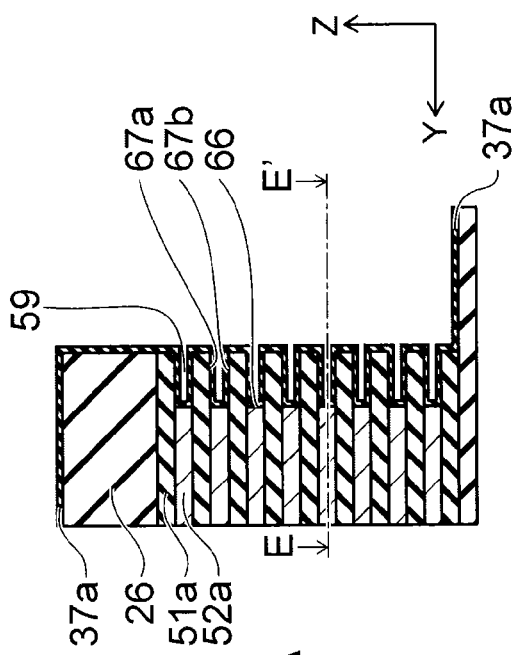
FIG. 23A is a cross-sectional view which illustrates the method for manufacturing the memory device according to the embodiment and is taken along line F-F' of FIG. 23C.
Figure 23B:
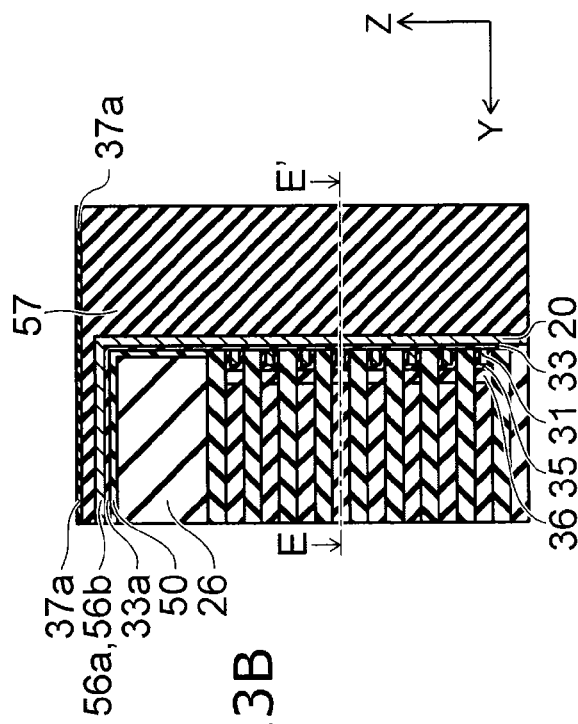
FIG. 23B is a cross-sectional view which illustrates the method for manufacturing the memory device according to the embodiment and is taken along line G-G' of FIG. 23C.

As shown in FIG. 23A to FIG. 23C, an inner surface 66, an upper surface 67a, and a lower surface 67b of the recess 59 formed by the recessing are covered with the silicon nitride layer 37a. Accordingly, in the following process, even if a conductive film for filling the recess 59 is formed by W or NiSi, the polysilicon film 52a of the wiring lead-out region 3 cannot be electrically connected thereto. Consequentially, as the process described below, a process of removing a portion of the silicon nitride layer 37a formed in the recess 59 is required.

As shown in FIG. 24A to FIG. 24C, a photoresist 68 is patterned so as to cover a portion of the wiring lead-out region 3. That is, a side in the forward direction of the Y-direction from the inner surface 66 of the recess 59 is masked, and the photoresist 68 is patterned such that the face of the recess 59 of the wiring lead-out region 3 formed by the recessing is exposed. Moreover, the photoresist 68 is patterned so as to cover most of the memory cell region 2. That is, the photoresist 68 is patterned such that among the memory elements 30 arranged in the Y-direction, at least the memory element 30 closest to the side of the end 58s of the trench 58 in the Y-direction is covered. As the photoresist, it is desirable to use negative photoresist that remains after exposure, since light does not reach the recess 59. The entire surface of the trenches 53 filled with the insulating film 57 and the entire surface of the memory elements 30 are covered with the silicon nitride layer 37a. As a result, during the following etching process, portions other than the silicon nitride layer 37a are not removed. Herein, a portion of the trench 58 is not covered with the photoresist 68, such that an etching solution or the like for performing etching as the following process can enter the trench 58 from an opening portion 58a.

As shown in FIG. 25A to FIG. 25C, by wet or dry etching, the exposed silicon nitride layer 37a is removed. In the portion corresponding to the connection portion 5, the silicon nitride layer 37a that covers the inner surface 66 and each of side surfaces 67 of the recess 59 is removed. Within the inner surface 66, the end face of the polysilicon film 52 is exposed, and within the upper surface 67a and the lower face 67b, the face of the silicon oxide film 51 as a layer adjacent thereto is exposed. In the memory cell region 2, after the silicon nitride layer 37a is removed, the silicon oxide layer 36 appears, hence the etching can be stopped. In the wiring lead-out region 3, after the silicon nitride layer 37a is removed, the polysilicon film 52a is exposed. Accordingly, depending on the etching technique, the etching amount needs to be controlled by controlling the etching rate or the like.

As shown in FIG. 26A to FIG. 26C, a polysilicon film 69 is formed on the entire surface of the resultant. Subsequently, as shown in FIG. 27A and FIG. 27B, a conductive layer 61 made of, for example, nickel (Ni) is formed by sputtering on the entire surface of the resultant, and the resultant is silicidated in a high-temperature environment. Thereafter, an unnecessary silicide layer is removed by etching. In this way, the connection wiring film 62 made of NiSi is formed in the recess 59.

Herein, when the connection wiring films and the control gate electrode films 21 are formed of W, instead of a process of depositing the polysilicon film 69 of FIG. 26A to FIG. 26C, a process of depositing W on the entire surface may be performed.

As shown in FIG. 28A and FIG. 28B, the conductive layer 61 placed in a position other than the inside of the recess 59 is removed by anisotropic etching such as RIE, whereby the control gate electrode film 21 is formed in the recess 59. Moreover, an unnecessary conductive layer 61 is removed; the interlayer insulating layer, the silicon pillars 20, and the bit-line 29 are connected to each other; and the control gate electrode films 21 and the word-line 39 are connected to each other; whereby the semiconductor memory device 1 is completed.

Herein, needless to say, the silicon nitride layers 37 and 37a that become the block insulating film may be other types of insulating layers. For instance, they may be silicon oxide layers ($SiO_2$). Furthermore, the block insulating film may be a layer with a high dielectric constant, such as an $Al_2O_3$ layer, an MgO layer, an SrO layer, an SiN layer, a BaO layer, a TiO layer, a $Ta_2O_5$ layer, a $BaTiO_3$ layer, a BaZrO layer, a $ZrO_2$ layer, a $Y_2O_3$ layer, a ZrSiO layer, an HfAlO layer, an HfSiO layer, an $La_2O_3$ layer, or an LaAlO layer.

In order to remove these block insulating films, in the case of wet etching, for example, it is possible to use an aqueous solution, which contains either an organic acid or an inorganic acid and a fluorine compound, or to use a mixture of a fluorine compound and an organic solvent. In the case of dry etching, it is possible to perform dry etching using chemicals containing fluorine.

For instance, when hafnium oxide ($HfO_2$) is used as the block film, the block insulating layer can be removed by using hydrofluoric acid (HF).

The procedure of the aforementioned manufacturing process is not limited to the above. For instance, the dividing process of the silicon pillars 20 or the like that was described with reference to FIG. 19 may be performed after the formation process of the control gate electrode films 21 that was described with reference to FIG. 28.

According to the aforementioned embodiments, a memory device, which makes it possible to easily lead out the control gate electrode films of the memory elements of the memory cell region as wiring to be connected to an external circuit or a peripheral circuit, and a method for manufacturing the same can be realized.

As described above, by adding a simple process, the block insulating film covering the recess 59 can be selectively removed, and the memory cell region 2 can be electrically connected to the wiring lead-out region 3. Moreover, by causing an etching medium to reliably enter the trenches 58, the range of the connection portion 5 can be adjusted. Therefore, a distance between the memory cell region 2 and the wiring lead-out region 3 can be adjusted in accordance with the process accuracy. Furthermore, in the wiring lead-out region 3, the same material as used for the stacked body including the polysilicon film 52 and the silicon oxide film 51 can be used for filling, and accordingly, a contact included in the wiring lead-out region 3 can be easily processed.

While certain embodiment has been described, this embodiment has been presented by way of example only, and is not intended to limit the scope of the inventions. Indeed, the novel embodiment described herein may be embodied in a variety of other forms; furthermore, various omissions, substitutions and changes in the form of the embodiment described herein may be made without departing from the spirit of the inventions. The accompanying claims and their equivalents are intended to cover such forms or modifications as would fall within the scope and spirit of the invention.

What is claimed is:

1. A semiconductor memory device comprising:
    a semiconductor member extending in a first direction in a memory cell region, the memory cell region arranging the semiconductor members in the form of a matrix along a second direction crossing the first direction and along a third direction crossing the first direction and the second direction;
    a first electrode film disposed at the lateral side of the semiconductor member in a state of being separated from the semiconductor member;
    a second electrode film provided between the semiconductor member and the first electrode film;
    a first insulating film provided between the semiconductor member and the second electrode film;
    a second insulating film provided between the second electrode film and the first electrode film; and
    a wiring film disposed in a wiring lead-out region adjacent to the memory cell region,
    the first electrode film being formed of a material different from a material of the wiring film, and being electrically connected to the wiring film.

2. The device according to claim 1,
    wherein the second insulating film including a first insulating layer including silicon nitride.

3. The device according to claim 2,
wherein the second insulating film includes the first insulating layer, a second insulating layer including silicon oxide and a third insulating layer including silicon nitride, and the first insulating layer, the second insulating layer and the third insulating layer are stacked from the first electrode film toward the second electrode film in this order.

4. The device according to claim 3,
wherein the first electrode film is extending along the second direction, and is electrically connected to the wiring film at an end of the first electrode film, the first insulating layer is formed along the first electrode film, and an end of the first insulating layer in the second direction is located by a given distance away from the end of the first electrode film.

5. The device according to claim 4,
wherein the first insulating layer is formed to surround a periphery of the first electrode film.

6. The device according to claim 1,
wherein the length of the first electrode film in the second direction is greater than the length of the wiring film.

7. The device according to claim 1,
wherein the first electrode film is formed of a material having a conductivity higher than that of the wiring film.

8. The device according to claim 1,
wherein the first electrode film includes either tungsten or nickel silicide.

9. The device according to claim 1,
wherein the wiring film includes polycrystalline silicon.

10. The device according to claim 1,
wherein the first electrode film is on a same plane as the wiring film.

11. The device according to claim 10,
wherein the second insulating film is disposed on the side surface of the first electrode film, and a cross-sectional area of an end of the wiring film is greater than a cross-sectional area of the first electrode film.

12. The device according to claim 11,
wherein the wiring film is connected to the first electrode film, through a connection wiring film which has a same cross-sectional area as the cross-sectional area of an end of the wiring film and is formed of a same material as the first electrode film.

13. A method for manufacturing a memory device, comprising:
forming a stacked body on a substrate by alternately stacking insulating films and first films;
forming first trenches that extend in a first direction in the stacked body;
forming first recesses by retracting an exposed surface of the first films in the inner surface of the first trenches;
forming first block insulating films on the inner surface of the first recesses;
forming floating gate electrode films inside the first recesses;
forming tunnel insulating films on the inner surface of the first trenches;
forming semiconductor films on the tunnel insulating films;
forming second trenches each of which extends in the first direction between the first trenches in the stacked body;
forming second recesses by removing the first films through the second trenches;
forming second block insulating films on the inner surface of the second recesses;
removing a portion of the second block insulating films;
forming control gate electrode films inside the second recesses from which the second block insulating films have been removed and inside the second recesses in which the second block insulating films are left; and
forming memory elements by dividing the semiconductor films and the floating gate electrode films along the first direction,
in the removing a portion of the second block insulating films, the second block insulating films in a position facing the memory elements being left, the second block insulating films in the other positions being removed, and
the material of the control gate electrode films being different from the material of the first films.

14. The method according to claim 13,
wherein the removing a portion of the second block insulating films includes removing the second block insulating films formed on the inner surface, upper surface, and lower surface of the second recesses.

15. The method according to claim 13,
wherein the second block insulating films include silicon nitride.

* * * * *